(12) United States Patent
Bornebroek

(10) Patent No.: US 6,297,876 B1
(45) Date of Patent: *Oct. 2, 2001

(54) LITHOGRAPHIC PROJECTION APPARATUS WITH AN ALIGNMENT SYSTEM FOR ALIGNING SUBSTRATE ON MASK

(75) Inventor: Frank Bornebroek, Eindhoven (NL)

(73) Assignee: ASM Lithography B.V., Veldhoven (NL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/036,488

(22) Filed: Mar. 6, 1998

(30) Foreign Application Priority Data

Mar. 7, 1997 (EP) .................................................. 97200682

(51) Int. Cl.[7] ............................ G03B 27/42; G03B 27/54; G01B 11/00
(52) U.S. Cl. ................................ 355/67; 355/53; 356/401
(58) Field of Search ................... 356/399, 400, 356/401; 355/53, 67, 77, 55; 250/559.3, 237, 548; 359/641, 558

(56) References Cited

U.S. PATENT DOCUMENTS

| 4,251,160 | 2/1981 | Bouwhuis et al. . |
| 4,540,277 | 9/1985 | Mayer et al. . |
| 4,778,275 | 10/1988 | Van Den Brink et al. . |
| 4,828,392 | 5/1989 | Nomura et al. . |
| 4,861,162 | 8/1989 | Ina . |
| 4,870,452 | 9/1989 | Tanimoto et al. . |
| 5,144,363 | 9/1992 | Wittekoek et al. . |
| 5,243,195 | 9/1993 | Nishi . |
| 5,347,356 | * 9/1994 | Ota et al. ........................... 356/401 |
| 5,477,057 | * 12/1995 | Angeley et al. .................... 356/401 |
| 5,801,390 | * 9/1998 | Shiraishi ............................ 250/559.3 |
| 5,808,910 | * 9/1998 | Irie et al. ........................... 356/399 |
| 5,920,376 | 7/1999 | Bruckstein et al. . |
| 5,920,378 | * 7/1999 | Murakami et al. .................. 355/53 |

OTHER PUBLICATIONS

Markle, D.A., "Submicron 1:1 Optical Lighography", Semiconductor International, pp. 137–142, May 1986.

* cited by examiner

Primary Examiner—Russell Adams
Assistant Examiner—Peter B. Kim
(74) Attorney, Agent, or Firm—Pillsbury Winthrop LLP

(57) ABSTRACT

A lithographic projection apparatus with an off-axis alignment unit for aligning a substrate alignment mark (P1) with respect to a reference (RGP) is described. This unit comprises a structure (WEP) of deflection elements (80–86) which give the sub-beams having different diffraction orders coming from the diffractive substrate mark (P1) different directions so that these sub-beams are incident on separate reference gratings (90–96) and can be detected by separate detectors (DET). This unit also provides the possibility of aligning asymmetrical alignment marks with great accuracy.

35 Claims, 9 Drawing Sheets

LITHOGRAPHIC PROJECTION APPARATUS WITH AN ALIGNMENT SYSTEM FOR ALIGNING SUBSTRATE ON MASK

BACKGROUND OF THE INVENTION

The invention relates to a lithographic projection apparatus comprising a radiation source supplying a projection beam, a mask holder, a substrate holder and a projection system arranged between the mask holder and the substrate holder, the apparatus further comprising an alignment system for ultimately aligning a substrate, provided in the substrate holder, with respect to a mask provided in the mask holder, the alignment system comprising an off-axis alignment unit for aligning an alignment mark, provided on a substrate, with respect to a reference.

Ultimate alignment is understood to mean that, although in the first instance the alignment unit is used for aligning a substrate with respect to a reference, the result of this alignment step is used in combination with other measurements for aligning the substrate with respect to the mask.

The lithographic projection apparatus is an essential component in the manufacture of integrated circuits, or ICs, by means of diffusion and masking techniques. With the aid of this apparatus, a number of masks having different mask patterns are successively imaged at the same position on a semiconductor substrate. The substrate must undergo the desired physical and chemical changes between the successive images at the same position. To this end, the substrate must be removed from the apparatus after it has been exposed with a mask pattern, and, after it has undergone the desired process steps, the substrate must be replaced at the same position again so as to expose it with a second mask pattern, and so forth, while it must be ensured that the images of the second mask pattern and the subsequent mask patterns are positioned accurately with respect to the substrate. To this end, the lithographic projection apparatus is provided with an optical alignment system with which alignment marks on the substrate are aligned with respect to alignment marks on the mask.

A lithographic apparatus may not only be used for the manufacture of ICs but also for the manufacture of other structures having detailed dimensions of the order of 1 micrometer. Examples are structures of integrated, or plenary, optical systems or guiding and detection patterns of magnetic domain memories, and structures of liquid crystal display panels. Also in the manufacture of these structures, images of mask patterns must be aligned very accurately with respect to a substrate.

The lithographic projection apparatus may be a stepping apparatus or a step-and-scan apparatus. In a stepping apparatus, the mask pattern is imaged in one run on an IC area of the substrate. Subsequently, the substrate is moved with respect to the mask in such a way that a subsequent IC area will be situated under the mask pattern and the projection lens system and the mask pattern is imaged on the subsequent IC area. This process is repeated until all IC areas of the substrate are provided with a mask pattern image In a step-and-scan apparatus, the above-mentioned stepping procedure is also followed, but the mask pattern is not imaged in one run but via scanning movement. During imaging of the mask pattern, the substrate is moved synchronously with the mask with respect to the projection system and the projection beam, taking the magnification of the projection system into account. A series of juxtaposed partial images of consecutively exposed parts of the mask pattern is imaged in an IC area. After the mask pattern has been completely imaged in an IC area, a step is made to a subsequent IC area. A possible scanning procedure is described in the article: "Sub-micron 1:1 Optical Lithography" by D. A. Markle in the magazine "Semiconductors International" of May 1986, pp. 137–142.

U.S. Pat. No. 5,243,195 discloses an optical lithographic projection apparatus provided with an alignment system and intended for the manufacture of ICs. This alignment system comprises an off-axis alignment unit for aligning a substrate alignment mark with respect to this alignment unit. In addition, this alignment system comprises a second alignment unit for aligning a substrate mark with respect to a mask mark via the projection lens (TTL). Alignment via the projection lens (on-axis alignment) is the most frequently used method in the current generation of optical lithographic projection apparatuses and provides the advantage that the substrate and the mask can be aligned directly, and thus very accurately, with respect to each other. When the off-axis alignment method is used, the baseline offset as described in U.S. Pat. No. 5,243,195 must be taken into account.

The on-axis alignment method has hitherto worked to full satisfaction, but it is to be expected that this alignment method may present problems with regard to reliability and accuracy when novel technologies are used in the IC manufacture and when the detailed sizes, or line widths, of the IC patterns decrease.

In connection with the increasing number of electronic components per unit of surface area of the substrate and the resultant smaller dimensions of these components, increasingly stricter requirements are imposed on the accuracy with which integrated circuits are made. The positions where the successive masks are imaged on the substrate must therefore be fixed more and more accurately. In the manufacture of new-generation ICs with smaller line widths, the alignment accuracy will have to be improved or, in other words, it must be possible to detect smaller deviations so that the resolving power of the alignment system must be increased. On the other hand, stricter requirements must also be imposed on the planeness of the substrate due to the required higher numerical aperture (NA) of the projection lens system in the case of decreasing line widths. The depth of focus of this system decreases as the NA increases. Since some image field curvature occurs at the desired relatively large image field of the projection lens system, there is hardly any room left for unevennesses of the substrate. To obtain the desired planeness of the substrate, it has been proposed to polish this substrate by means of the chemical mechanical polishing (CMP) process between two consecutive exposures with different mask patterns in the projection apparatus. However, this polishing process affects the accuracy of the on-axis alignment method. In this method, a grating is used as a substrate alignment mark and the sub-beams diffracted in the first order by this grating are used for imaging the substrate mark on the mask mark. In this process, it is assumed that the substrate is aligned correctly with respect to the mask when the point of gravity of the substrate grating mark is aligned with respect to the point of gravity of the mask alignment mark. In that case it has been assumed that the point of gravity for each grating mark coincides with the geometric center of the grating. However, the CMP process renders the substrate grating mark asymmetrical so that this alignment method is no longer reliable.

Furthermore, the manufacturing process for new-generation ICs is becoming more and more complicated: the number of process steps and the number of process layers on the substrate increase more and more. Some of these layers also introduce asymmetries in the substrate grating mark and hence alignment errors.

Moreover, when the known on-axis alignment method is used, strict requirements must be imposed on the depth of the grating grooves of the substrate mark which is a phase grating.

It is an object of the present invention to provide an alignment system for a lithographic projection apparatus in which the influence of said effects on the alignment signal is reduced considerably and which is more accurate and reliable than known alignment systems. To this end, the system according to the invention is characterized in that the alignment mark is a diffractive mark and in that the alignment unit is adapted to separately detect a number of at least three sub-beams diffracted by the diffractive mark in different diffraction orders which are higher than 0, each sub-beam comprising an indication about the position of the substrate mark with respect to the reference.

Adapting the alignment unit such that it separately detects at least three subbeams with different diffraction orders does not mean that three or more sub-beams have to be detected simultaneously, but means that the alignment unit provides the possibility to separately detect all these sub-beams. In practice sub-beams can be detected or not and simultaneously or not.

A diffractive mark is a mark that splits a beam of electromagnetic radiation into a number of sub-beams of different diffraction orders. Such mark may be comprise a diffraction grating or by another diffraction element.

The invention is based on the recognition that better use can be made of the properties of a diffractive alignment mark if this mark is no longer used in combination with an on-axis alignment unit but in combination with an off-axis alignment unit. As described in U.S. Pat. No. 4,251,160, an image of the substrate grating having a period which is half the period of the substrate grating itself is obtained in an on-axis alignment unit in which a diffraction grating is used as a substrate alignment mark and in which only the first-order sub-beams of the substrate grating are used for imaging this mark on a corresponding grating alignment mark. Consequently, the alignment accuracy is twice as great as in the case where also the zero-order sub-beam and the higher-order sub-beams would jointly be used for this image. In the alignment unit described in U.S. Pat. No. 4,251,160, the first-order sub-beams are selected by an order diaphragm incorporated in the projection lens. Such a diaphragm considerably complicates the design of the projection lens which is already complicated anyway, and providing the projection lens with an order diaphragm which also passes higher:r orders, i.e. orders higher than 1, is not very well possible. By providing a diffractive alignment mark in an off-axis alignment unit, a great extent of freedom is created to select higher-order sub-beams of this alignment mark. The fact that, as a higher order is selected, the resolving power of the alignment unit is enhanced, may then be used to advantage.

The invention is also based on the recognition that the higher-order subbeams are determined by the edges of a grating mark rather than by its center and that, as compared with the center, these edges are less vulnerable to the CMP process or to other measures affecting the asymmetry of the grating. By using the higher-order sub-beams, not only the problem of asymmetric alignment gratings is eliminated, but the accuracy of the alignment unit is also enhanced.

It is to be noted that it is known from U.S. Pat. No. 4,828,392 to make use of a plurality of higher-order sub-beams from the substrate mark for aligning a substrate with an asymmetric alignment mark. However, the asymmetric mark is a mark whose grating grooves are asymmetrical with respect to the centerline of these grooves, and use is made of an order diaphragm which must be incorporated in the projection lens system and must be provided with a large number of apertures. The quality of the image of the mask pattern proper on the substrate is thereby undoubtedly affected.

U.S. Pat. No. 5,477,057 also describes an off-axis alignment unit for a scanning lithographic apparatus. A separate alignment sensor head for aligning a substrate mark with respect to an apparatus reference is arranged next to and against the projection lens system. The reason for using an off-axis alignment unit is the wish to use a wide-band alignment radiation which cannot adequatly be transmitted by the monochromatic projection lens system. The Patent does not describe a diffractive alignment mark or states the use of a plurality of higher-order sub-beams during alignment.

U.S. Pat. No. 4,870,452 describes an off-axis alignment unit for the substrate in which a plane-parallel plate is arranged between the projection lens system and the substrate. This plate is completely transparent to the projection beam but has a different reflection and transmission coefficient for the alignment beam. This plate must ensure that the alignment beam is incident at an acute angle to the substrate alignment mark and, after reflection, is directed at a given angle onto the detection system by this mark. The substrate mark may be, for example a grating mark and separate detectors may be provided for the sub-beams formed by this mark with different diffraction orders. However, only the $0^{th}$-order, the $1^{st}$-order and the $2^{nd}$-order sub-beams are used for the detection. It is not clear why beside the $1^{st}$-order, also the $0^{th}$-order and the $2^{nd}$-order sub-beams are used. In practice, it will be preferred not to provide a plane-parallel plate between the projection lens system and the substrate and it is doubtful whether this plate can separate the different orders to a sufficient extent.

A preferred embodiment of the projection apparatus according to the invention is further characterized in that said reference consists of a structure of a number of separate reference elements equal to the number of used diffraction orders and having the same shape as the substrate alignment mark, and in that a separate detector is associated with each of these elements for converting the sub-beam coming from the substrate mark and passed by the relevant diffractive reference element into an electric signal.

The apparatus may further be characterized in that the reference elements are gratings.

The alignment detection is then based on a grating-to-grating image which has proved to be reliable in the past.

To achieve that the sub-beams of the different diffraction orders can be detected in a well-separated manner without the alignment unit becoming too voluminous, the apparatus is preferably further characterized in that the radiation path between the substrate mark and the reference elements successively incorporates a first lens system, a structure of deflection elements arranged the paths of the sub-beams from the first lens system to give the separate sub-beams different directions, and a second lens system arranged behind said deflection elements for concentrating the sub-beams on the associated diffractive reference elements.

This embodiment is preferably further characterized in that the distance between the plane of the substrate mark and the first lens system is equal to the focal length of the first lens system, in that the distance between the second lens system and the plane of the reference elements is equal to the focal length of the second lens system and in that the distance between the first lens system and the second lens system is equal to the sum of the focal length of the first lens system and that of the second lens system.

The two lens systems together then constitute a telecentric lens system and the axial position of the structure of deflection elements is not critical anymore.

The apparatus is preferably further characterized in that the structure of deflection elements comprises a pair of deflection elements for each diffraction order to deflect the sub-beams of this diffraction order with opposed diffraction order signs such that the second lens system converges these sub-beams on one associated reference element.

Then, both the plus orders and the minus orders of the substrate mark are used for imaging this mark on the reference elements and optimal use is made of the available alignment radiation.

Several embodiments of the structure of deflection elements are possible. A first embodiment is characterized in that it comprises a number of discrete optical wedges, which number is equal to the number of sub-beams.

These wedges may be manufactured as separate elements and then fixed to a common transparent carrier plate. Preferably, the discrete wedges are manufactured in one process step by a replication technique, well-known in the optical art. A negative of the whole structure of wedges, present in a mould, is then printed in a layer of synthetic, for example, UV curable material provided on, for example, a plate of quartz.

Severe requirements are to be set to the mutual accuracy of, for example, the slope of the wedge surfaces of two wedges which are used for deflecting the +order and −order sub-beams of the same diffraction order. These requirements can be satisfied more easily in a second embodiment of the structure of deflection elements which is characterized in that it comprises a number of wedge-shaped transparent plates which are arranged one behind the other in the path of the sub-beams and have different wedge angles and a number of openings to pass radiation undeflected, the number of openings and their positions being such that with a combination of n plates $2^n$ diffraction orders can be deflected in different directions in a binary way.

These wedges have the advantage that they can be manufactured relatively easily with the desired precision.

The substrate alignment mark may be a linear grating. When designing such a grating, the desired distribution of the radiation among the different diffraction orders can be taken into account.

To be able to align in two mutually perpendicular directions, the apparatus is further characterized in that the substrate mark comprises two grating portions, in which the direction of the grating strips of the first grating portion is perpendicular to that of the grating strips of the second grating portion in that the structure of deflection elements is a two-dimensional structure and in that the reference is a two-dimensional reference.

The apparatus is preferably further characterized in that the off-axis alignment unit comprises two radiation sources which supply beams of different wavelengths, and a beam splitter for combining the two beams on their path to the substrate mark and for splitting the beams reflected by this mark, and in that a separate structure of deflection elements and reference elements is present for each of these beams.

It is then not necessary to impose strict requirements on the groove depth of the substrate mark.

A practical embodiment of the apparatus is further characterized in that a second off-axis alignment unit is present, and in that the first-mentioned alignment unit and the second alignment unit are arranged diametrically with respect to the projection system.

The off-axis alignment system can also be used for aligning a further alignment mark on the substrate holder with respect to the reference. Then the alignment of the substrate mark with respect to the substrate holder mark can be determined.

To be able to realize the ultimate alignment of the mask pattern with respect to the substrate, the apparatus is further characterized in that the alignment system also comprises an on-axis alignment unit for aligning the substrate holder with respect to the mask pattern.

The on-axis alignment unit may be of the type comprising a radiation source which emits a beam having a wavelength which is different from that of the projection beam, but may be alternatively constituted by an image sensor operating with projection radiation.

The invention can also be used in lithographic apparatus which comprises a projection station for projecting a mask pattern onto a first substrate and a measuring station for measuring the position of a second substrate. An embodiment of such an apparatus, having two substrate stages which commute between the measuring station and the projection station is shown in U.S. Pat. No. 4,861,162. Such apparatus has the advantage that its throughput, i.e. the number of wafers that can be processed in one hour, is considerably larger than that of a comparable apparatus having only a projection station and no measuring station.

A dual station lithographic projection apparatus wherein the invention is implemented is characterized in that the measuring station comprises an off-axis alignment unit as described above.

These and other aspects of the invention are apparent from and will be elucidated with reference to the embodiments described hereinafter.

DETAILED DESCRIPTION

For better understanding of the present invention, a known optical lithographic projection apparatus provided with an on-axis alignment unit and other measuring systems, in which the invention may be used, will be described first.

Figure 1:
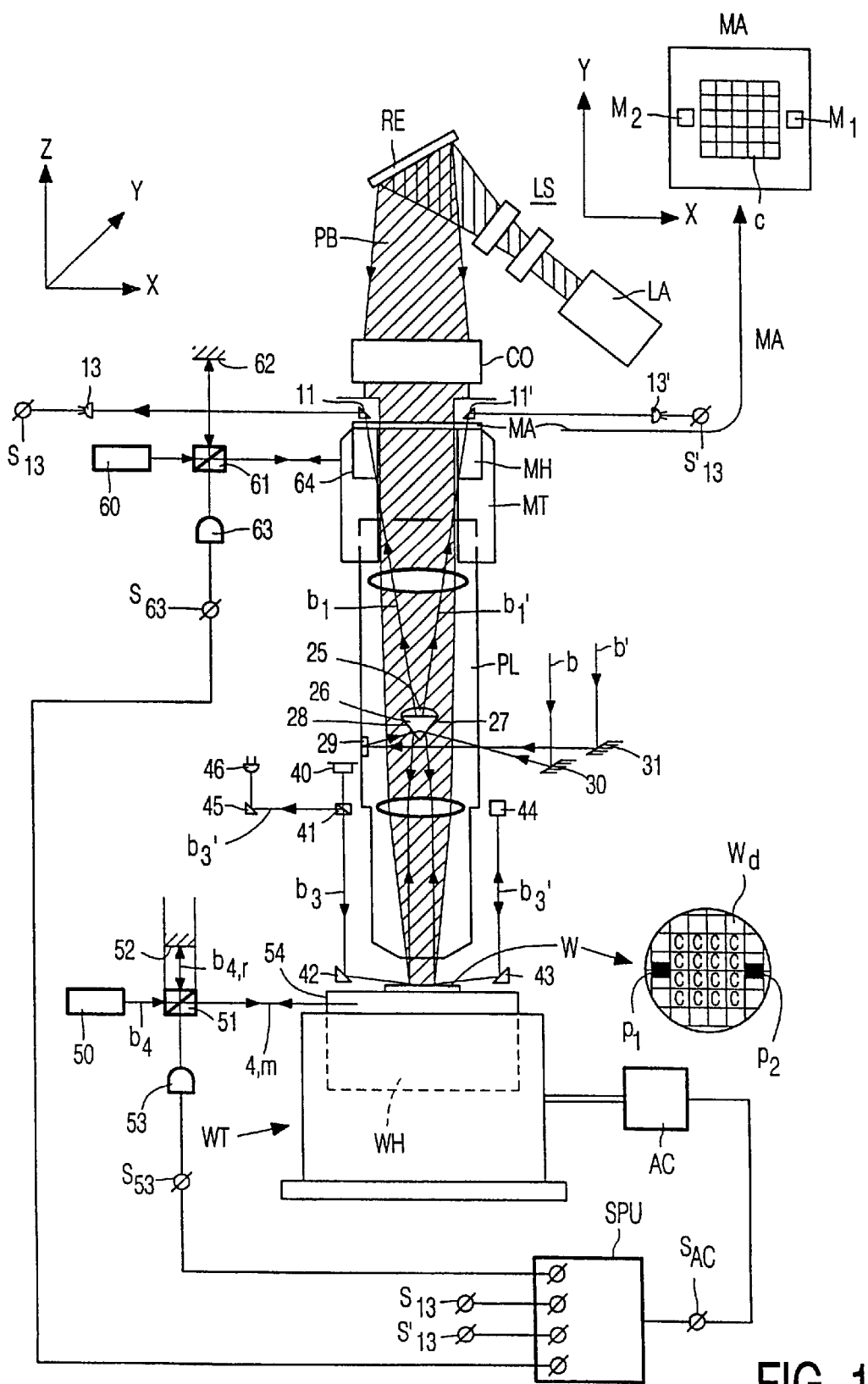
FIG. 1 shows an embodiment of a step-and-scan projection apparatus with the various measuring systems.

FIG. 1 shows diagrammatically the optical elements of an embodiment of such an apparatus for step-and-scan imaging a mask pattern on a substrate. This apparatus comprises, as its main component, a projection column incorporating a projection system PL. Situated above this system is a mask holder MH for a mask MA in which the mask pattern C to be imaged is provided. The mask holder is part of a mask table MT. A substrate table WT is arranged below the projection lens system PL. This table comprises a substrate holder WH for a substrate W provided with a photosensitive layer. The mask pattern C must be imaged a number of times in the photosensitive layer, every time in a different area, an IC area $W_d$. The substrate table is movable in the X and Y directions so that, after imaging the mask pattern in a first IC area, a subsequent IC area can be positioned under the mask pattern.

The apparatus further comprises an illumination system which is provided with a radiation source LA, for example a Krypton-Fluoride Excimer laser or a mercury lamp, a lens system LS, a mirror RE and a condensor lens CO. The projection beam PB supplied by the illumination system illuminates the mask pattern C. This pattern is imaged by the projection lens system PL on an IC area of the substrate W. The projection lens system has, for example, a magnification M=¼, a numerical aperture NA=0.6 and a diffraction-limited image field with a diameter of 22 mm.

The apparatus is further provided with a number of measuring systems, namely a system for aligning the mask MA and the substrate W with respect to each other in the XY plane, an interferometer system for determining the position and orientation of the substrate holder and hence of the substrate, and a focus error detection system for determining a difference between the focal or image plane of the projection lens system PL and the surface of the substrate W. These measuring systems are parts of servosystems which comprise electronic signal-processing and control circuits and drivers, or actuators, with which the position and orientation of the substrate and the focusing can be corrected with reference to the signals supplied by the measuring systems.

Figure 2:
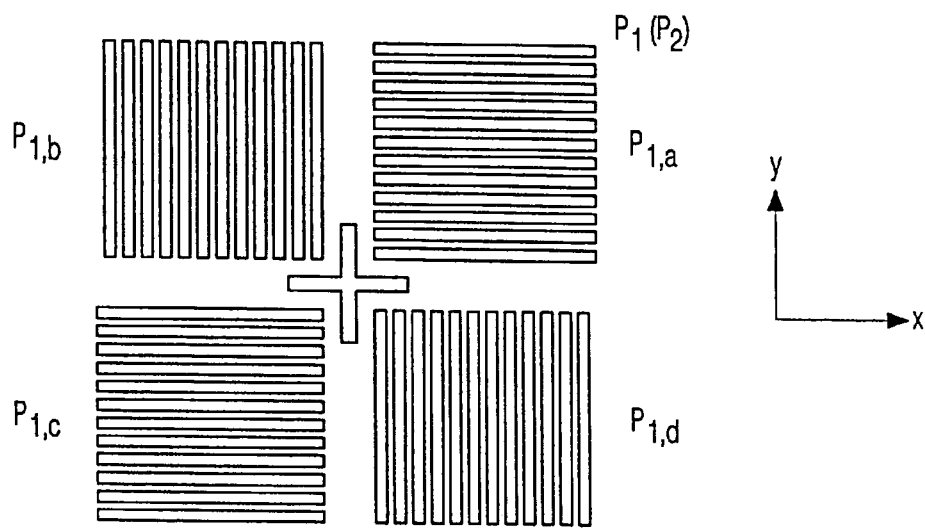
FIG. 2 shows an embodiment of a substrate alignment mark.

The on-axis alignment system makes use of two alignment marks $M_1$ and $M_2$ in the mask MA shown in the top right part of FIG. 1. As is shown in FIG. 2, these marks preferably consist of diffraction gratings but may be alternatively constituted by other marks such as squares or strips which are optically distinguished from their surroundings. The alignment marks are preferably two-dimensional, i.e. they extend in two mutually perpendicular directions, the X and Y directions in FIG. 1. The substrate W, for example a semiconductor substrate, has at least two alignment marks, preferably also two-dimensional diffraction gratings, two of which, $P_1$ and $P_2$, are shown in FIG. 1. The marks $P_1$ and $P_2$ are situated outside the IC areas on the substrate W. The grating marks $P_1$ and $P_2$ are preferably implemented as phase gratings and the grating marks $M_1$ and $M_2$ are preferably implemented as amplitude gratings.

FIG. 1 shows a special embodiment of an on-axis alignment unit, namely a double alignment unit in which two alignment beams b and b' are used for aligning the substrate alignment mark $P_2$ on the mask alignment mark $M_2$, and for aligning the substrate alignment mark $P_1$ on the mask alignment mark $M_1$, respectively. The beam b is reflected by a reflecting element 30, for example a mirror, towards the reflecting surface 27 of a prism 26. The surface 27 reflects the beam b towards the substrate alignment mark $P_2$ which sends a part of the radiation as beam $b_1$ to the associated mask mark M where an image of the mark $P_2$ is formed. Situated above the mark $M_2$ is a reflecting element 11, for example a prism, which directs the radiation passed by the mark $M_2$ towards a radiation-sensitive detector 13.

The second alignment beam b' is reflected by a mirror 31 towards a reflector 29 in the projection lens system PL. This reflector sends the beam b' to a second reflecting surface 28 of the prism 26, which surface directs the beam b' onto the substrate alignment mark $P_1$. This mark reflects a part of the radiation of the beam b' as beam $b'_1$ to the mask alignment mark $M_1$ where an image of the mark $P_1$ is formed. The radiation of the beam $b'_1$ passing through the mark $M_1$ is directed by a reflector 11' towards a radiation-sensitive detector 13'.

FIG. 2 shows an embodiment of one of the two identical substrate marks, in the form of phase gratings, on a larger scale. Such a grating may consist of four sub-gratings $P_{1,a}$, $P_{1,b}$, $P_{1,c}$ and $P_{1,d}$, two of which, $P_{1,b}$ and $P_{1,d}$, serve for alignment in the X direction and the two other ones, $P_{1,a}$ and $P_{1,c}$, serve for alignment in the Y direction. The two sub-gratings $P_{1,b}$ and $P_{1,c}$ have a grating period of, for example 16 $\mu$m and the sub-gratings $P_{1,a}$ and $P_{1,d}$ have a grating period of, for example 17.6 $\mu$m. Each sub-grating may have a dimension of, for example 200×200 $\mu$m. An alignment accuracy which, in principle, is smaller than 0.1 $\mu$m can be achieved with this grating mark and a suitable optical system. By choosing different grating periods, the capture range of the alignment unit can be enlarged. This range is, for example 40 $\mu$m.

Figure 3:
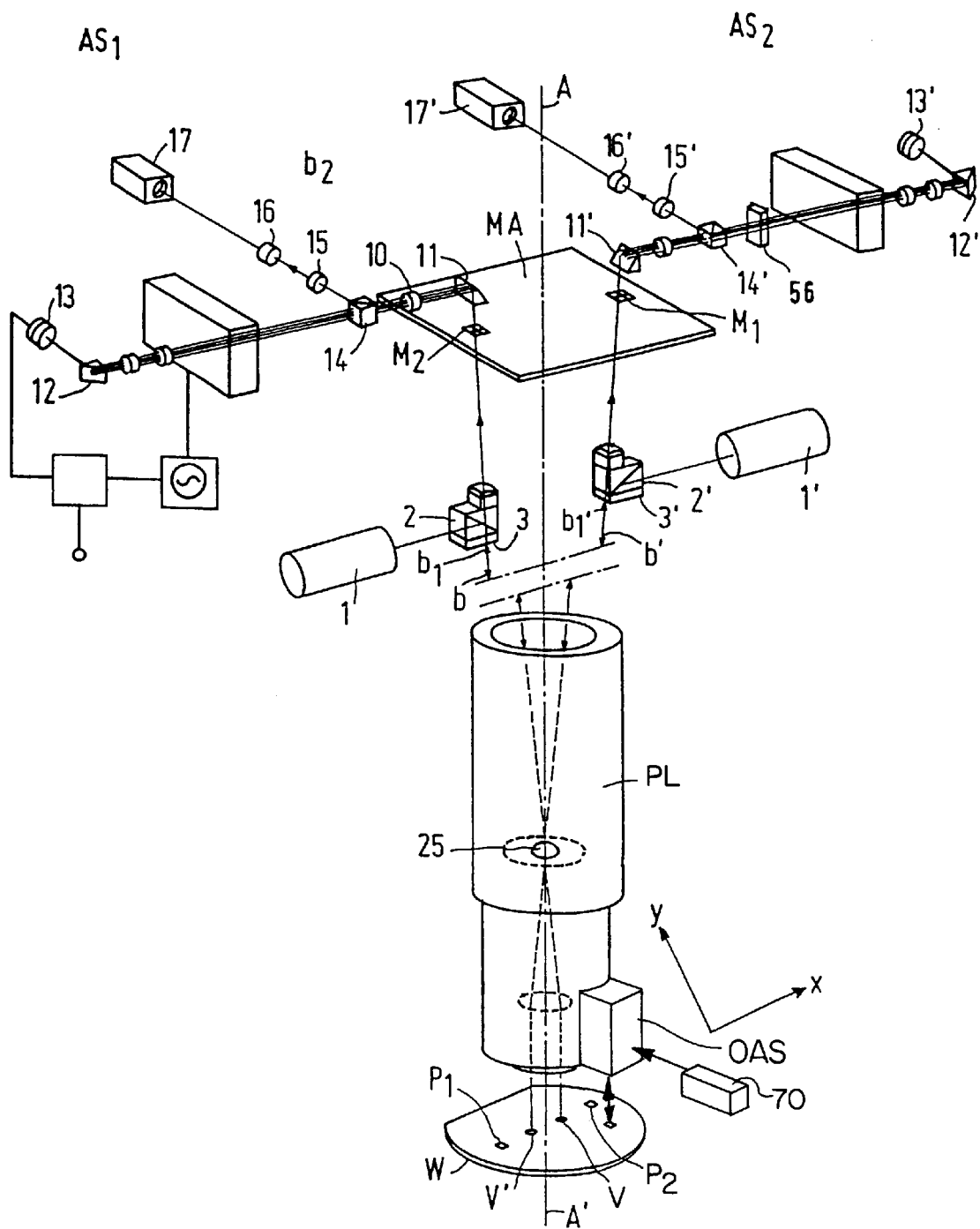
FIG. 3 shows an embodiment of a double alignment unit for aligning a mask mark and a substrate mark with respect to each other.

FIG. 3 shows the optical elements of a, slightly modified, alignment unit in greater detail. The double alignment unit comprises two separate and identical alignment systems $AS_1$ and $AS_2$ which are positioned symmetrically with respect to the optical axis AA' of the projection lens system PL. The alignment system $AS_1$ is associated with the mask alignment mark $M_2$ and the alignment system $AS_2$ is associated with the mask alignment mark $M_1$. The corresponding elements of the two alignment systems are denoted by the same reference numerals, those of the system $AS_2$ being primed so as to distinguish them from those of the system $AS_1$.

The structure of the system $AS_1$ will now be described, as well as the way in which the mutual position of the mask mark $M_2$ and, for example, the substrate mark $P_2$ is determined with this system.

The alignment system $AS_1$ comprises a radiation source 1, for example a Helium-Neon laser emitting an alignment beam b. This beam is reflected to the substrate W by a beam splitter 2. The beam splitter may consist of a semi-transparent mirror or a semi-transparent prism but is preferably constituted by a polarization-sensitive splitting prism 2 preceding a $\lambda/4$ plate 3, in which $\lambda$ is the wavelength of the beam b. The projection lens system PL focuses the beam b in a small radiation spot V, having a diameter of the order of 1 mm, on the substrate W. This substrate reflects a part of the beam as beam $b_1$ towards the mask MA. The beam $b_1$ traverses the projection lens system PL, which system images the radiation spot V on the mask. Before the substrate is arranged in the projection apparatus, it has been pre-aligned in a pre-alignment station coupled to the apparatus, for example the station described in EP Patent Application 0 164 165, such that the radiation spot V is located on the substrate mark $P_2$. This mark is then imaged on the mask mark $M_2$ by the beam $b_1$. With the magnification M of the projection lens system being taken into account, the dimension of the mask mark $M_2$ is adapted to that of the substrate mark $P_2$ so that the image of the mark $P_2$ coincides accurately with the mark $M_2$ when the two marks are mutually positioned correctly.

On its path to and from the substrate W, the beams b and $b_1$ have traversed the $\lambda/4$ plate 3 twice, whose optical axis is at an angle of 45° to the direction of polarization of the linearly polarized beam b coming from the source 1. The beam $b_1$ passing through the $\lambda/4$ plate then has a direction of polarization which is rotated 90° with respect to the beam b so that the beam $b_1$ is passed by the polarization splitting prism. The use of the polarization splitting prism in combination with the $\lambda/4$ plate provides the advantage of a minimal radiation loss when coupling the alignment beam into the radiation path of the alignment system.

The beam $b_1$ passed by the alignment mark $M_2$ is reflected by a prism 11 and directed, for example by a further reflecting prism 12 towards a radiation-sensitive detector 13. This detector is, for example a composite photodiode having, for example four separate radiation-sensitive areas in conformity with the number of sub-gratings shown in FIG. 2. The output signals of the detector areas are a measure of coincidence of the mark $M_2$ with the image of the substrate mark $P_2$. These signals can be processed electronically and used for moving the mask and the substrate with respect to each other by means of driving systems (not shown), such that the image of the mark P coincides with the mark M. An automatic alignment system is thus obtained.

A beam splitter 14 in the form of, for example a partially transparent prism splitting a portion of the beam $b_1$ as beam $b_2$ may be arranged between the prism 11 and the detector 13. The split beam is incident via, for example two lenses 15 and 16 on a television camera 17 which is coupled to a monitor (not shown) on which the alignment marks $P_2$ and $M_2$ are visible to an operator of the projection apparatus. This operator can then ascertain whether the two marks coincide and move the substrate W by means of manipulators so as to cause the marks to coincide.

Analogously as described hereinbefore for the marks $M_2$ and $P_2$, the marks $M_1$ and $P_2$ and the marks $M_1$ and $P_1$ can be aligned with respect to each other. The alignment system $AS_2$ is used for the last-mentioned two alignments.

For further particulars about the construction and the alignment procedure of the double on-axis alignment unit, reference is made to U.S. Pat. No. 4,778,275.

The embodiment of the on-axis alignment unit shown in FIG. 1 is particularly suitable for an apparatus in which a projection beam PB having a short wavelength, for example 248 nm, and an alignment beam having a considerably larger wavelength, for example 633 nm, are used.

Since the projection lens system is designed for the wavelength of the projection beam PB, differences occur when this system PL is used for imaging the alignment marks $P_1$, $P_2$ and $M_1$ and $M_2$ on each other by means of the alignment beam. For example, the substrate alignment marks will not be situated in the plane of the mask pattern in which the mask alignment marks are situated, but will be imaged at a given distance therefrom, which distance depends on the difference between the wavelength of the projection beam and the alignment beam and the difference between the refractive indices of the material of the projection lens elements for the two wavelengths. If the projection beam has a wavelength of, for example 248 nm and the alignment beam has a wavelength of 633 nm, this distance may be 2 m. Moreover, due to said wavelength difference, a substrate alignment mark is imaged on a mask alignment mark with a magnification which differs from the desired magnification and increases with an increasing wavelength difference.

To correct for said differences, the projection lens system PL incorporates an extra lens, a correction lens, 25. The correction lens is arranged at such a height in the projection lens that, on the one hand, in the plane of the correction lens the sub-beams of the different diffraction orders of the alignment beam, which sub-beams originate from, and are also generated by, a substrate alignment mark, are sufficiently separated to be able to influence these sub-beams separately and, on the other hand, this correction lens has a negligible influence on the projection beam and the mask pattern image formed with it. The correction lens is preferably situated in the Fourier plane of the projection lens system. If, as is shown in FIG. 3, the correction lens 25 is situated in a plane in which the chief rays of the alignment beams b and b' intersect each other, then this lens can be used for correcting both alignment beams.

If desired, a wedge or a different deflection element such as a diffraction element may be arranged in the path of the alignment beam(s) proximate to an alignment mark. With such a deflection element, not shown in FIG. 3, alignment errors resulting from unintentional phase differences within the selected alignment beam portions received by the detector 13 or 13' may be prevented, which phase differences may occur if the axis of symmetry of the alignment beam portions coming from a substrate alignment mark is not perpendicular to the mask plate, so that false reflections may occur within this plate. An alignment unit provided with such a deflection element is described in EP Patent Application 0 467 445.

In addition to the global alignment marks $P_1$ and $P_2$, shown in FIG. 1, which are used for aligning the entire substrate with respect to the mask, referred to as global alignment, the substrate may be provided with further alignment marks per IC area so as to align each IC area separately with respect to the mask pattern. The mask may also comprise more than two alignment marks in which the further alignment marks may be used, for example to measure the rotation of the mask about the Z axis so that this rotation can be corrected.

The projection apparatus further comprises a focus error detection system for determining a deviation between the focal plane of the projection lens system PL and the surface of the substrate W, so that this deviation can be corrected, for example by moving the projection lens system along its axis, the Z axis. This system may be constituted by the elements 40, 41, 42, 43, 44, 45 and 46 which are arranged in a holder (not shown) which is, fixedly connected to the projection lens system. The reference numeral 40 denotes a radiation source, for example a diode laser, which emits a focusing beam $b_3$. This beam is directed at a small angle onto the substrate by a reflecting prism 42. The beam reflected by the substrate is directed towards a retroreflector 44 by the prism 43. The element 44 reflects the beam in itself so that the beam ($b_3'$) once again traverses the same path via reflections on the prism 43, the substrate W and the prism 42.

The beam $b_3'$ reaches a radiation-sensitive detection system 46 via a partially reflecting element 41 and a reflecting element 45. This detection system consists of, for example a position-dependent detector, or of two separate detectors. The position of the radiation spot formed by the beam $b_3'$ on this system is dependent on the extent to which the focal plane of the projection lens system coincides with the plane of the substrate W. For an extensive description of the focus error detection system, reference is made to U.S. Pat. No. 4,356,392.

For accurately determining the X and Y positions of the substrate holder, a stepping projection apparatus is provided with a multi-axis interferometer system. U.S. Pat. No. 4,251,160 describes a system with two measuring axes and U.S. Pat. No. 4,737,283 describes a system with three measuring axes. In FIG. 1, such an interferometer system is diagrammatically shown by means of the elements 50, 51, 52, 53, and 54, while only one measuring axis, the X axis, is shown. A beam $b_4$ emitted by a radiation source 50 in the form of a laser is split by a beam splitter 51 into a measuring beam $b_{4,m}$ and a reference beam $b_{4,r}$. The measuring beam reaches a reflecting side face 54 of the substrate holder WH and the reflected measuring beam is combined by the beam splitter 51 with the reference beam reflected by a stationary retroreflector 52, for example a corner cube. The intensity of the combined beam is measured with a detector 53, and the displacement, in this case in the X direction, of the substrate holder WH can be derived from the output signal of this detector, and also an instantaneous position of this holder can be determined.

As is diagrammatically shown in FIG. 1, the interferometer signals, represented for the sake of simplicity by one signal $S_{53}$, and the signals $S_{13}$ and $S'_{13}$ of the double alignment unit are applied to a signal-processing unit SPU, for example a microcomputer, which processes said signals to control signals $S_{AC}$ for an actuator AC with which the substrate holder is moved in the XY plane via the substrate table WT.

With an interferometer system, which has not only the X measuring axis shown in FIG. 1 but also a Y measuring axis and possibly a third measuring axis, the positions of, and the mutual distances between, the alignment marks $P_1$, $P_2$ and $M_1$, $M_2$ can be fixed in a system of coordinates defined by the stationary interferometer system during the initial, or global, alignment of the mask and the substrate with respect to each other. This interferometer system is also used for moving the substrate table very accurately, which is necessary for a stepping projection apparatus so as to be able to step very accurately from a first IC area to a second IC area.

If, as shown in FIG. 1, the projection apparatus is a step-and-scan apparatus, in which the mask and the substrate must be moved synchronously during the projection of the mask pattern in an IC area, the mask must also be moved in one direction, the scanning direction. With the magnification M of the projection lens system being taken into account, this movement must be synchronous with the corresponding movement of the substrate. Then, the mask and the substrate must stand still with respect to each other during projection and both must be moved with respect to the projection lens system and the projection beam. To measure the movement of the mask, the apparatus must be provided with a second interferometer system. This interferometer system comprises the elements 60, 61, 62, 63 and 64 which have a similar function as the elements 50, 51, 52, 53 and 54, respectively. The signals from the mask interferometer system, represented for the sake of simplicity by a signal $S_{63}$ in FIG. 1, are applied to the signal-processing unit SPU in which these signals are compared with the corresponding signals from the substrate interferometer system. It can then be ascertained whether the mask and the substrate mutually have the correct position and/or move synchronously.

If the positions in the X and Y directions of the mask are represented by $X_r$, $Y_r$ and those of the substrate by $X_w$, $Y_w$ and the rotation about the Z axis by $\phi_{z,w}$ and $\phi_{z,w}$, then the following conditions are satisfied when the mask and the ubstrate are correctly positioned with respect to each other:

$$X_{x,w} - M \cdot X_r = 0 \qquad (1)$$

$$Y_w - M \cdot Y_r = 0 \qquad (2)$$

$$\phi_{z,w} - \phi_{z,r} = 0 \qquad (3)$$

in which M is the magnification of the projection lens system. It has been assumed that the mask and the substrate move in opposite directions. If these elements move in the same direction, the minus sign preceding M in the above conditions should be replaced by a plus sign.

To ascertain whether these conditions have been met, it is sufficient that both the interferometer system for the substrate and that for the mask have three measuring axes.

However, the substrate interferometer system preferably has five measuring axes. Then, not only $X_w$, $Y_w$ and $\phi_{z,w}$, but also $\phi_{x,w}$ and $\phi_{y,w}$, i.e. the tilt, about the X axis and the Y axis can be measured.

To be able to measure such tilts of the mask, a five-axis mask interferometer system may be used, or a combination of a three-axis interferometer system for determining $X_r$, $Y_r$ and $\phi_{z,r}$ and other sensors such as capacitive sensors for the $\phi_{x,r}$ and $\phi_{y,r}$ measurements.

If $X_w$, $Y_w$, $\phi_{z,w}$, $\phi_{x,w}$, $\phi_{y,w}$ and $X_r$, $Y_r$, $\phi_{z,r}$, $\phi_{x,r}$, $\phi_{y,r}$ and, with the aid of the focus error detection system, $Z_w$ and $Z_r$, i.e. the positions along the Z axis of the substrate and the mask can be measured, it can be ascertained whether not only the conditions (1), (2) and (3) are met, but also the conditions:

$$M^2 \cdot Z_w - Z_r = 0 \qquad (4)$$

$$M \cdot \phi_{x,w} - \phi_{x,r} = 0 \qquad (5)$$

$$M \cdot \phi_{y,w} - \phi_{y,r} = 0 \qquad (6)$$

The on-axis alignment unit, described with reference to FIG. 3, for mutually aligning a mask alignment mark and a substrate alignment mark with respect to each other has been found to be eminently suitable for both stepping and step-and-scan projection apparatuses with which images having line widths up to a given minimal value are formed. However, it is expected that the use of novel technologies in the IC manufacture and decreasing line widths in the images will lead to problems as far as accuracy and reliability of the known alignment unit are concerned. When reducing the line width, the alignment accuracy must be enhanced. When using said CMP process so as to flatten the substrate in the meantime, asymmetries are introduced in the substrate grating mark so that the alignment procedure in which the first-order sub-beams are used becomes unreliable. Moreover, when using an alignment beam having one wavelength, strict requirements must be imposed on the depth of the grating grooves of the alignment mark, which requirements can only be met with increasing difficulty.

Figure 4:
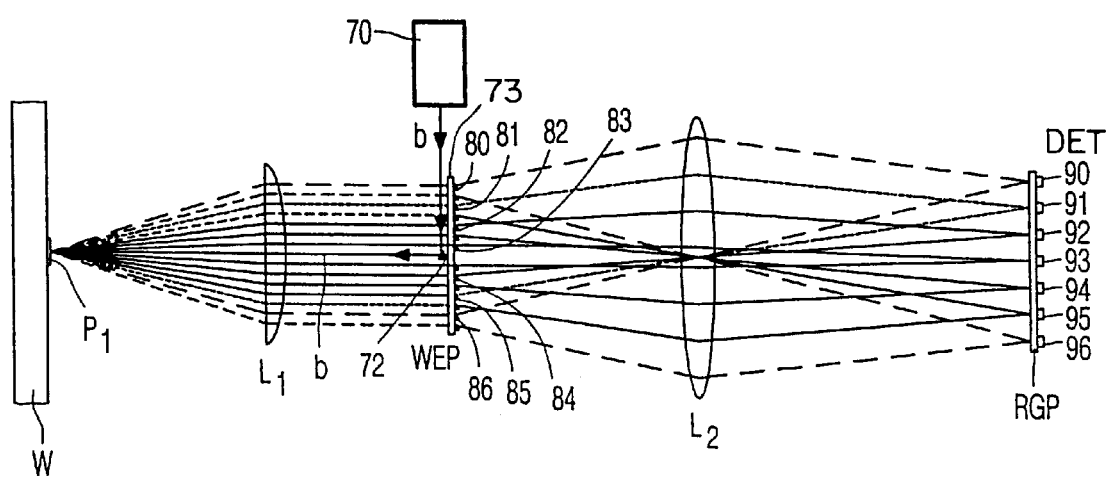
FIG. 4 shows an embodiment of an off-axis alignment unit according to the invention.

All of these problems can be solved by making use of an off-axis alignment unit for aligning the substrate mark and by using higher-order sub-beams, i.e. sub-beams having a diffraction order which is higher than 1, in the alignment. FIG. 3 shows an off-axis alignment unit which includes an off-axis alignment sensor OAS, as represented in FIG. 4, located next to and against the projection lens system and an off-axis alignment radiation source 70. An off-axis alignment unit as shown in FIG. 3 is not required in the operation of a lithographic projection apparatus according to the present invention, but provides an additional benefit. Since the alignment of the substrate mark no longer takes place through the projection lens system, there will be greater freedom to use more sub-beams, particularly higher-order sub-beams. Since the resolving power of the alignment unit increases with an increasing order number of the sub-beams, the accuracy of the alignment can be enhanced considerably. Since notably the higher-order sub-beams are determined by the edges of the substrate grating mark and, as compared with the center of the grating, these edges are less influenced by said CMP process; and other measures affecting the symmetry of the grating, the problem of asymmetry in the grating mark is largely eliminated. Moreover, it is also possible to use alignment radiation with more than one wavelength so that the requirements imposed on the depth of the grating grooves can be alleviated considerably.

As will be elucidated hereinafter, the diffraction orders are separated from each other by optical elements in the alignment unit according to the invention, not by electronic means and/or associated software. Consequently, it is not necessary to measure signal amplitudes but the phase measurements which are more conventional in these kinds of techniques can be used.

FIG. 4 shows the circuit diagram of the novel off-axis alignment unit. The substrate mark, in the form of a grating, is denoted by $P_1$. A parallel alignment beam b having a wavelength $\lambda$ incident on this grating is split up into a number of sub-beams extending at different angles $\alpha_n$ (not shown) to the normal on the grating, which angles are defined by the known grating formula:

$$\sin\alpha_n = \frac{N \cdot \lambda}{P} \quad (7)$$

wherein N is the diffraction order number and P the grating period.

The path of the sub-beams reflected by the grating incorporates a lens system $L_1$ which converts the different directions of the sub-beams into different positions $u_n$ (not show) of these sub-beams in a plane 73:

$$u_n = f_1 \cdot \alpha_n \quad (8)$$

in which $f_1$ is the focal length of the lens system $L_1$. In the this plane means are provided for further separating the different sub-beams. To this end, a plate may be arranged in this plane, which is provided with deflection elements in the form of, for example wedges 80–86. In FIG. 4, the wedge plate is denoted by WEP. The wedges are provided on, for example the rear side of the plate. A prism 72 can then be provided oil the front side of the plate, with which an alignment beam coming from the radiation source 70, for example a He—Ne laser can be coupled into the alignment unit. This prism can also prevent the 0-order sub-beam from reaching the detectors. The number of wedges corresponds to the number of sub-beams which is to be used. In the embodiment shown, there are six wedges per dimension for the plus orders so that the sub-beams can be used up to and including the $7^{th}$-order for the alignment. All wedges have a different wedge angle so that an optimal separation of the different sub-beams is obtained.

A second lens system $L_2$ is arranged behind the wedge plate. This lens system images the mark $P_1$ in a plane in which a reference plate RGP is present. In the absence of the wedge plate, all sub-beams would be superimposed in the reference plane. Since the different sub-beams through the wedge plate are deflected at different angles, the images formed by the sub-beams reach different positions in the reference plane. These positions $X_n$ (not shown) are given by $$X_n = f_2 \cdot \gamma_n \quad (9)$$

in which $f_2$ is the focal length of the lens is the angle at which a sub-beam is deflected by the wedge plate.

Figure 5:
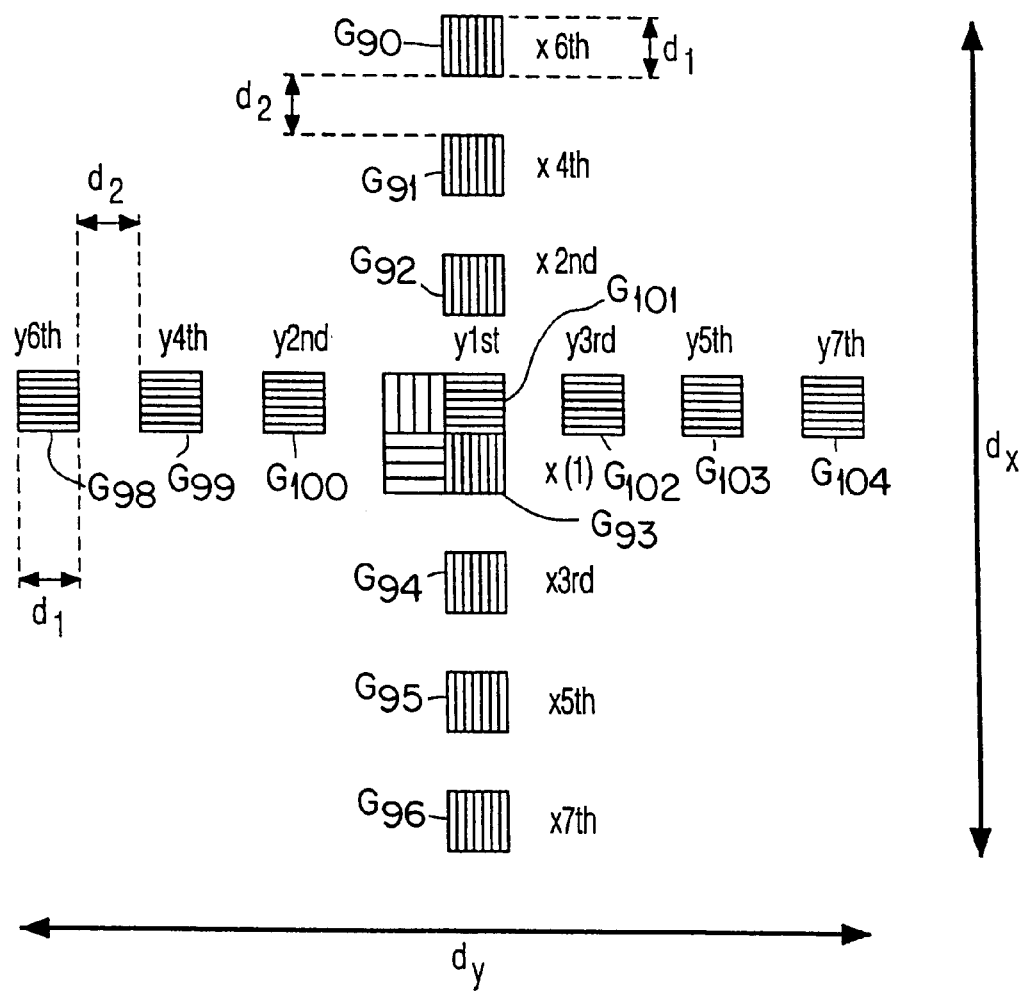
FIG. 5 shows a plate with reference gratings used in this embodiment.

At these positions, reference gratings $G_{90}$–$G_{96}$ are provided in the reference plate shown in FIG. 5. A separate detector 90–96 (DET) is arranged behind each of these reference gratings. The output signal of each detector is dependent on the extent to which the image of the substrate grating $P_1$ coincides with the relevant reference grating. Hence, the extent of alignment of the substrate grating, and thus of the substrate, can be measured with each detector 90–96. However, the accuracy with which the measurement takes place is dependent on the order number of the sub-beam used; as this order number is larger, the accuracy is greater. In FIG. 5 it has been assumed for the sake of simplicity that all reference gratings $G_{90}$–$G_{96}$ have the same grating period. Actually, however, the grating period of each grating is adapted to the order number of the associated sub-beam. As the order number is larger, the grating period is smaller and a smaller alignment error can be detected.

Hitherto only one set of diffraction orders has been considered. As is known, a diffraction grating forms, in addition to +1, +2, +3 etc order sub-beams, also sub-beams of diffraction orders −1, −2, −3 etc. Both the plus orders and the minus orders sub-beams are to be used to form the grating image, i.e. a first image of the grating mark is formed by the +1 and −1 order sub-beams jointly, a second image is formed by the +2 and −2 order sub-beams jointly, and so forth. For the +1 order and the −1 order sub-beams no wedges need to be used, but plane-parallel plates which compensate for path-length differences can be provided at the positions of these subbeams in the plane of the wedge plate. Thus six wedges, both for the plus orders and for the minus orders, are required for the orders 2–7.

Figure 6:
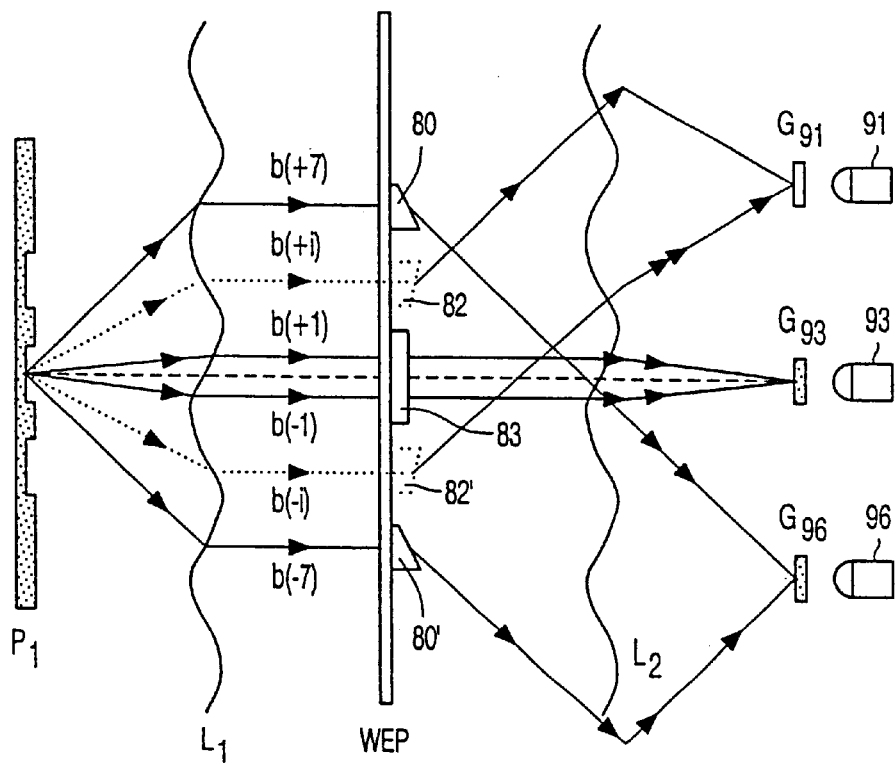
FIG. 6 shows the deflection by the wedge elements in this embodiment.

FIG. 6 illustrates more clearly the functioning of the wedges of the embodiment of FIG. 4. In the, more schematic, FIG. 6 the first lens system $L_1$ and the second lens system $L_2$ are represented by wavy lines. For clearness sake only the sub-beams of the first orders b(+1) and b(−1), the sub-beams of the seventh order b(+7) and b(−7) and the sub-beams of another order b(+i) and b(−i), for example the fourth order, are shown. As FIG. 6 illustrates, the wedge angles, i.e. the angle which the inclined face of the wedge makes with the plane surface of the wedge plate WEP, of the wedges 80 and 80' are such that the sub-beams b(+7) and b(−7) are deflected in parallel directions and converged by the second lens system on one reference grating $G_{96}$. Also the sub-beams b(+i) and b(−i) are deflected by the associated wedges 82 and 82' in parallel directions and converged on one reference grating $G_{91}$. The first order sub-beams are not deflected and are converged by the second lens system on one reference grating $G_{93}$. By using both the plus order and the minus order of each diffraction order a truthful image of the substrate grating mark $P_1$ is formed on the associated reference grating and a maximum use is made of the available radiation. Detectors 91, 93, and 96 are shown behind the reference gratings $G_{91}$, $G_{93}$, and $G_{96}$, respectively.

Figure 7:
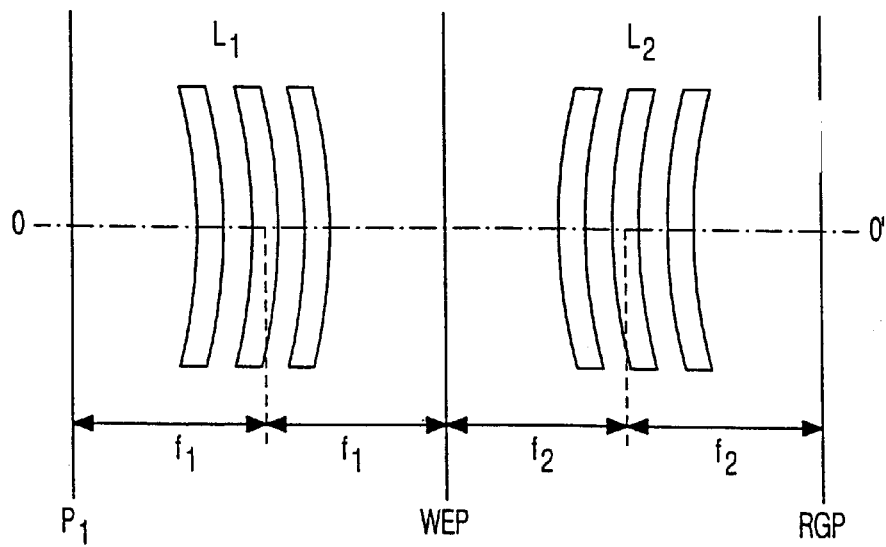
FIG. 7 shows a preferred arrangement of the first and second lens systems in the alignment unit.

FIG. 7 shows the preferred positions, with respect to the plane of the mark $P_1$ and the reference grating plate RGP, of the lens systems $L_1$ and $L_2$ and the focal lengths of these first lens system $L_1$. The lens system has a focal length $f_1$ and this system is arranged at a distance $f_1$ from the plane of the mark $P_1$. The lens system $L_1$ deflects the chief rays of the sub-beams in directions parallel to the optical axis OO'. The distance between the first lens system $L_1$ and the second lens system $L_2$ is equal to $f_1+f_2$, $f_2$ being the focal length of the second lens system. The reference grating plate is arranged at a distance $f_2$ from the second lens system. Since the chief rays of the sub-beams are parallel to the optical axis OO' in the path between the two lens systems, the position of the wedge plate is not critical.

In order that in the embodiment of FIG. 4 the plus- and minus order sub-beams of the same diffraction order are deflected such that they can be correctly superposed by the second lens system on the associated reference grating, stringent requirements are to be set to the mutual quality of the two associated wedges. These quality requirements relate to the quality of the inclined faces of the wedges and to the wedge angles.

Figure 8:
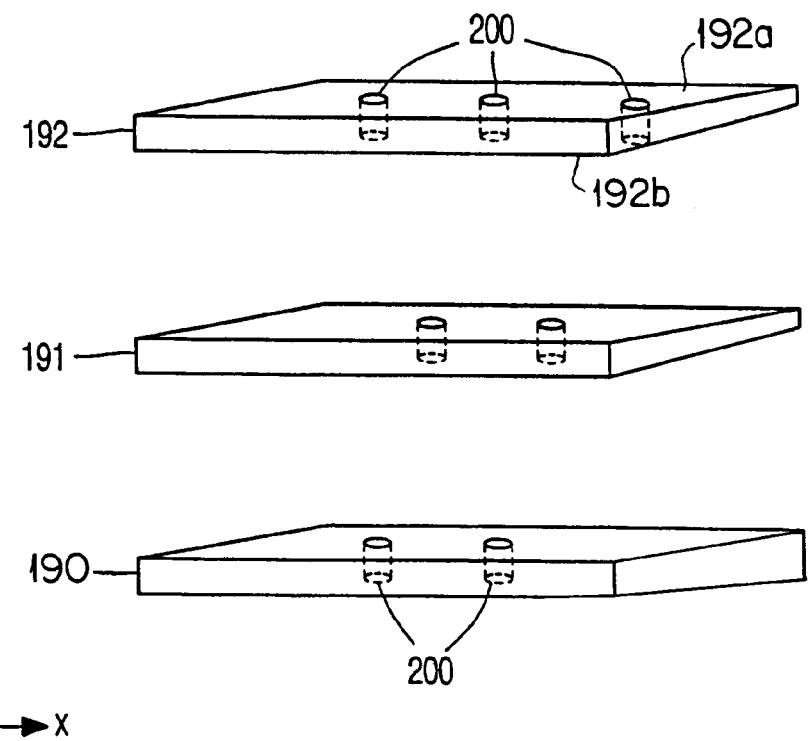
FIG. 8 shows a series of wedge-shaped plates to be used as the structure of deflection elements in a second embodiment of the alignment unit.

To lessen said requirements and to release the tolerances of the alignment unit. preferably use is made of the structure of deflection elements shown in FIG. 8. Instead of one discrete wedge for each sub-beam a number of, for example three, wedge plates 190, 191, 192, which are common to all sub-beams, are used. FIG. 8 shows a perspective view and FIG. 9 a side view of the wedge plates. The wedge angle, i.e. the angle between the upper face and the lower face of a plate, for plate 192 the angle between the face 192a and the face 192b, are different for the three plates. One of the plates, for example plate 190, has a wedge angle which is opposite to those of the other plates. The plates are provided with a number of openings 200, only a few of which are shown in FIG. 8. These openings are arranged at positions where sub-beams are incident on the relevant plate. However, not at every such position an opening is present. If a sub-beam is incident on an opening in a plate it will not be deflected by this plate.

Figure 9:
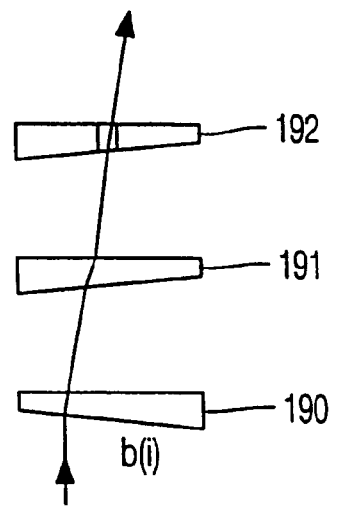
FIG. 9 illustrates how this series deflects a sub-beam.

On its way through the plates a sub-beam will encounter zero, one or two openings. Only the first order sub-beams encounter zero openings and are not deflected by any of the plates. In FIG. 9 the path through the plates of one of the sub-beams is shown. This sub-beam is deflected to the right by the first plate 190. Subsequently this sub-beam is deflected over a smaller angle to the left. Finally this sub-beam passes through an opening 200 in the plate 192 so that no further deflection occurs. For each of the sub-beams the number of openings and the order of the plate in which such opening is present is different from those of the other sub-beams, so that the sub-beams are all deflected in different directions. It will be clear that with a combination of three plates $2^3=8$ different deflection directions can be realized. As a pair of sub-beams of the same diffraction order is deflected by the same wedge plates, the risk that these sub-beams are not deflected in parallel directions is minimized.

In the embodiment of FIGS. 4 and 5, sub-beams with an order number of 1 to 7 are used so that seven reference gratings $G_{90}$–$G_{96}$ are necessary for the alignment in the X direction. For the alignment in the Y direction, seven sub-beams may also be used together with seven further reference gratings $G_{98}$–$G_{104}$, as is shown in FIG. 5. A second series of twelve wedges is then arranged on the wedge plate in the Y direction in the embodiment of FIG. 4. In the embodiment of FIG. 8 a second series of three wedge plate s is then arranged in the path of the sub-beams before or behind the first series of wedge plates, which second series of plates deflect the sub-beams in Y-directions. The substrate mark may be the mark shown in FIG. 2. For the first-order sub-beams, a similar reference grating may be used with four grating portions, two of which have a grating period of 8.0 $\mu$m, while the two other grating portions have a period of 8.8 $\mu$m as is shown in FIG. 5. The other reference gratings have only one grating period which corresponds to the relevant diffraction order of the grating portions with a period of 16 $\mu$m of the substrate grating $P_1$. The capture range of 44 $\mu$m associated with the grating mark $P_1$ of FIG. 2 is then maintained.

In the embodiment of FIGS. 4 and 5, the sub-beams having the highest order number are deflected by the deflection elements through the largest angle. However, this is not necessary. Under circumstances, this order may be modified, for example for minimizing optical aberrations in the grating images. That may also be the reason why the sub-beams with an ascending order number are deflected by the wedges alternately at a positive angle and a negative angle, as is shown in FIG. 6.

The minimum number of diffraction orders which has to be detected to be able to align in a sufficiently accurate way at a given asymmetry of the substrate mark $P_1$ can be determined by means of computer simulations. Such simulations have proved that, for example an alignment error of 150 nm which remains when a first-order sub-beam is used can be reduced to 20 nm when a fifth-order sub-beam is used.

In principle, the maximum number of orders which can be detected is determined by the minimum intensity which can still be detected and by the numerical aperture of the lens system $L_1$, $L_2$. As is known, the intensity of the sub-beam formed by a diffraction grating quickly decreases with an increase of the order number of this sub-beam; the intensity of a sub-beam is inversely proportional to the square of the order number of this sub-beam. For a seventh-order sub-beam, the intensity is thus approximately $\frac{1}{50}$ of that of a first-order sub-beam. The intensity loss due to reflections undergone by an alignment beam when traversing the off-axis alignment unit is, however, considerably smaller than when it traverses an on-axis alignment unit. In the last-mentioned unit, the alignment beam meets, for example approximately one hundred surfaces on which reflection losses may occur and in the first-mentioned unit it meets, for example only twenty of these surfaces. If the total reflection loss is a factor of four in the off-axis alignment unit, the $7^{th}$-order alignment sub-beam may have as much intensity as a $1^{st}$-order alignment beam in the on-axis alignment unit.

The numerical aperture $NA_n$ which the optical system $L_1$, $L_2$, must have to pass a sub-beam with a diffraction order of N is given by:

$$NA_n = \sin\left(N \cdot \frac{\lambda}{P}\right) \tag{10}$$

in which $\lambda$ is the wave length of the incident radiation and P is the grating period. For a $7^{th}$-order sub-beam, a substrate grating mark with a grating period P=16 $\mu$m and a wavelength $\lambda$=544 nm, the desired numerical aperture is approximately 0.24, which is a very acceptable number.

To guarantee a sufficiently stable system, the different reference gratings are provided on a single plate RGP which preferably consists of quartz. The dimensions of this plate, hence the image field of the second lens system, are determined by the dimension $d_1$ of the reference gratings and their mutual distance $d_2$. This distance and dimension are, for example, both 0.2 mm so that the dimensions $d_x$ and $d_y$ in the X and Y directions of the plate RGP are 2.8 mm and the desired field diameter is approximately 3 mm.

The discrete wedges of the embodiment of FIG. 4 may be made of glass or quartz and fixed to a quartz plate. This structure shows a high degree of stability. The wedges may also be made of a transparent synthetic material, for example an UV curable plastics. In that case it is preferred to use a replication technique, known per se in optics, to print the whole wedge structure by means of a mould in one run in a thin layer of this material, which layer is applied to, for example a quartz substrate. As already remarked, instead of discrete wedges preferably wedge plates provided with openings are used. Instead of discrete wedges or wedge plates other deflection elements may be alternatively used, such as diffraction gratings of which only one order is used. Furthermore it is possible to use deflection structures constituted by patterns of refractive index variations in the material of a plate, which patterns are provided, for example by means of ion implantation.

Figure 10:
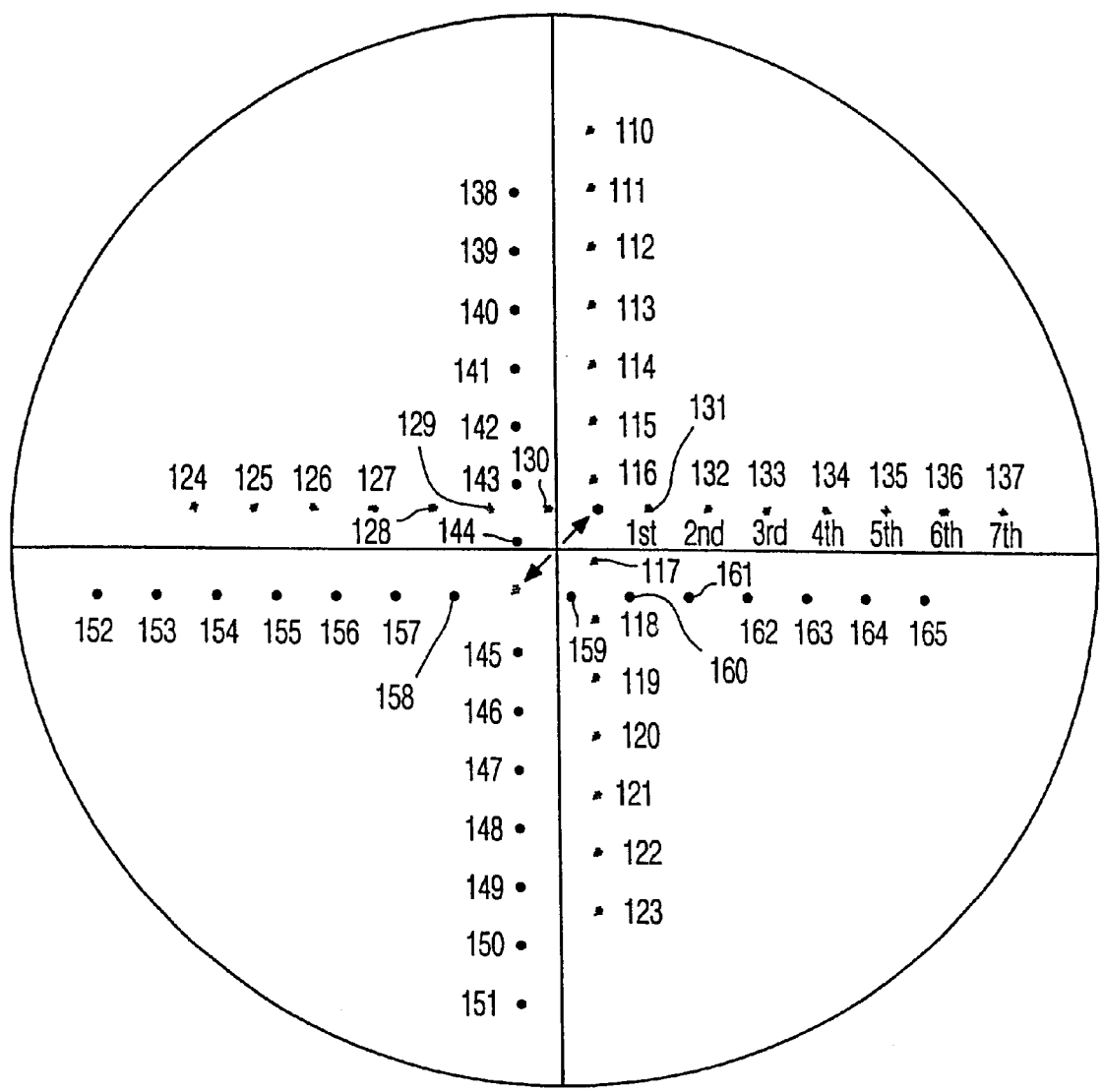
FIG. 10 shows the positions of the sub-beams in the plane of this plate in an embodiment of the alignment unit in which alignment radiation with two wavelengths is used.

In order that not too stringent requirements have to be imposed on the groove depth of the substrate mark, alignment radiation having two wavelengths, for example 633 nm and 532 nm, is preferably used. Use can be made of the fact that the angles at which the alignment grating deflects the sub-beams and the positions which these beams occupy in the rear focal plane of the lens system $L_1$ is dependent on the wavelength, as is apparent from the expressions (7) and (8). In principle, the orders for the different wavelengths can be distinguished from each other. Without further measures, however, a given order, for example the second order of the first wavelength (633 nm) may come between, for example the second and third orders of the second wavelength (532 nm). To separate the orders of the different wavelengths better from each other, it can be ensured that the beams with the different wavelengths are incident at different angles on the substrate grating $P_1$. For the case where seven diffraction orders are used, the situation as shown in FIG. 10 is then created in the rear focal plane of the lens system $L_1$. Now, there is a first cross-shaped pattern of positions 110–137 for the different orders of the first wavelength and a second cross-shaped pattern of positions 138–165 for the different orders of the second wavelength. As is shown by means of the double arrow in the center of FIG. 10, these patterns are offset with respect to each other, which is due to the different angles of incidence of the alignment beams with the different wavelengths. These angles should be maintained as minimal as possible so as to prevent alignment errors occurring due to defocusing effects. When using two wavelengths, the plate with deflection elements must of course be adapted to the situation as is shown in FIG. 10, which means, inter alia, that instead of 24 discrete wedges 48 wedges must be used., or that instead of 6 wedge-shaped plates twelve of such plates must be used.

Figure 11:
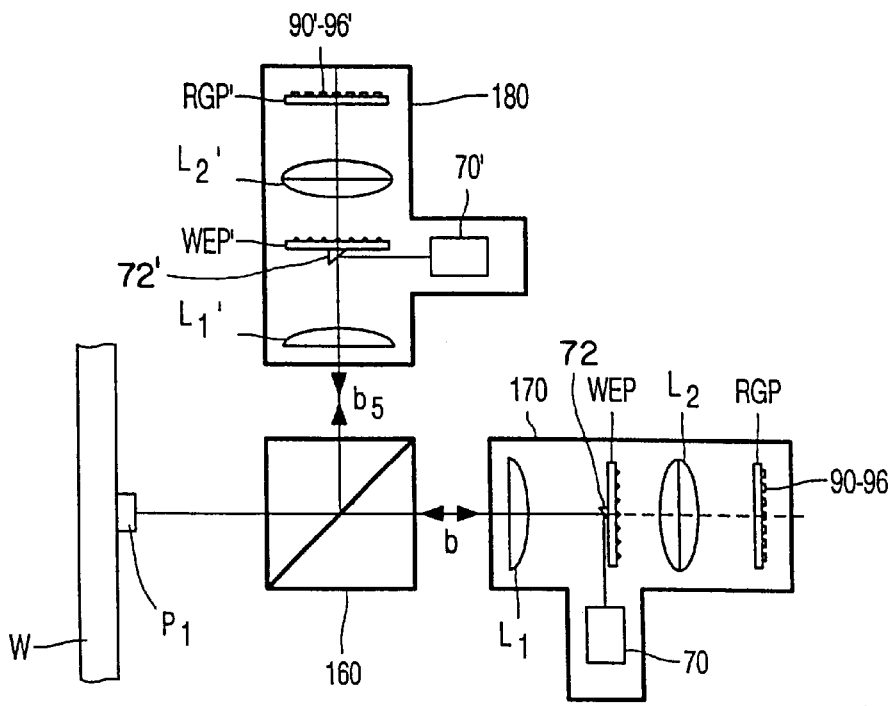
FIG. 11 shows an embodiment of the alignment unit in which two wavelengths are used.

A better alternative for the alignment with two wavelengths is illustrated in FIG. 11. In this Figure, the reference numeral 160 denotes a polarization-sensitive beam splitter. This beam splitter receives a first alignment beam b having a first wavelength $\lambda_1$, for example 633 nm, from a He—Ne laser, and having a first direction of polarization and passes this beam to the substrate alignment mark $P_1$. Incident on this beam splitter is also a second alignment beam $b_5$ which has a second wavelength $\lambda_2$, for example 532 nm and comes from a YAG laser preceding a frequency doubler. The beam $b_5$ has a direction of polarization which is perpendicular to that of the beam b so that the beam $b_5$ is reflected to the substrate mark $P_1$. It has been ensured that the chief rays of the beams b and $b_5$ are made to coincide by the beam splitter so that these beams will be passed as one beam to the mark $P_1$. After reflection by the mark, the beams b and b5 are split again by the beam splitter. A separate alignment unit 170, 180 is present for each of these beams. Each of these units emits an alignment beam and receives, via the beam splitter, the sub-beams of the different diffraction orders coming from the substrate mark. In each of these units, images of the substrate mark are formed on different reference gratings and with different sub-beams, as has been described with reference to FIG. 4. To this end, each unit is provided with a lens system $L_1$, $L_2$ ($L_1'$, $L_2'$), a wedge plate WEP (WEP') and or a series of wedge-shaped plates as shown in FIG. 8, a plate with reference gratings RGP (RGP'), a number of detectors 90–96 (90'–96') and a radiation source 70 (70') whose beam is coupled into the system via a coupling prism 72 (72').

Figure 12:
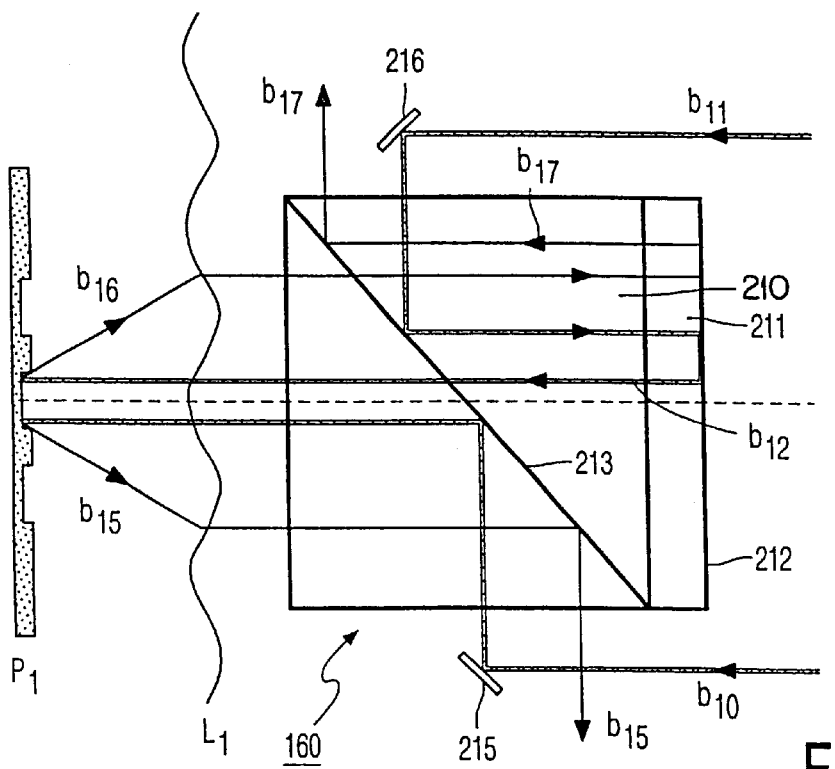
FIG. 12 shows a preferred beam splitter for use in this embodiment.

FIG. 12 shows part of an embodiment of the alignment unit wherein a special and preferred kind of beamsplitter 160 is used. This beamsplitter comprises a polarisation-sensitive beam splitting prism 210, a quarter-wave plate 211 and a reflector 212. The beams $b_{10}$ and $b_{11}$ having different wavelength and coming from sources, which are not shown, are indicated by thick lines and the beams reflected by the grating mark $P_1$ by thin lines. The beams $b_{10}$ and $b_{11}$ have the same polarization direction. The first beam $b_{10}$ is reflected by a reflector 215 towards the polarization-sensitive beam-splitting layer 213 in the prism 210. This layer reflects the beam $b_{10}$ towards the grating mark $P_1$. The radiation reflected by the grating mark and splitted-up in sub-beams of different diffraction orders is represented by one single beam ray $b_{15}$. The beam $b_{15}$ is reflected by the layer 213 towards the associated structure of deflection elements and detectors which are not shown in FIG. 12.

The second beam $b_{11}$ is reflected by the reflector 216 towards the beam-splitting, layer 213 which reflects the beam towards the quarter-wave plate 211. After the beam $b_{11}$ has passed this plate it is reflected by the reflective layer 212 at the backside of this plate, so that it passes for a second time through the plate 211. The beam $b_{12}$ leaving the plate 211 has a polarization direction which is rotated over 90° with respect to the polarization direction of the original beam $b_{11}$. The beam $b_{12}$ can pass the beam splitting layer 213 and reach the grating mark $P_1$. The radiation reflected by this mark is also indicated by a single beam ray $b_{16}$. This beam passes first the beam-splitting layer 213, then traverses twice the quarter-wave plate 211 and finally is reflected by the layer 213 towards the associated structure of wedges and detectors, not shown in FIG. 12. It is only for clearness sake that in FIG. 12 the reflected beams $b_{16}$ and $b_{17}$ are represented as spatially separated beams; in practice these beams coincide. The same holds for the beams $b_{10}$ and $b_{11}$ at the position of the mark $P_1$.

In the embodiments of FIGS. 11 and 12 the first lens system $L_1$ is preferably arranged between the beam splitter 216 and the grating mark $P_1$, as shown in FIG. 12. This has the additional advantage that only one such lens system is needed for the two beams of different wavelengths. For the reflected beams separate second lens systems $L_2$, not shown in FIG. 12, remain necessary.

In the different embodiments described above the detectors are arranged directly behind the reference gratings. In practice however, behind the reference gratings a bundle of imaging fibers may be arranged which image each of the reference gratings and the superimposed image of the substrate grating mark on a detector at a remote location, which is more convenient with respect to the design of the whole apparatus and with respect to the performance of this apparatus. For example, cross-talk between the images formed by the sub-beams of the different diffraction orders can be decreased and heat generated by signal amplifiers and electronic processors can be kept away from the alignment unit and the apparatus. Also the radiation sources may be arranged at positions remote from the alignment unit and their radiation can also be guided to the unit by an illumination bundle of fibers. In this way the heat generated by the radiation sources can be kept away from the alignment unit and the projection apparatus.

Between the prism 216 and the second lens system $L_2$ for one of the beams $b_{15}$ and $b_{17}$ a partially transmitting reflector may be arranged to split-off a portion of this beam towards a camera which, together with a monitor, provides a visual image of the substrate mark to an operator of the apparatus.

There are different possibilities of using the various detector signals. A start may be made with the alignment by means of the first-order sub-beams by processing the signals of the detectors associated with these sub-beams. Subsequently, the signals of the detectors associated with the second-order sub-beams may be used for finer alignment, then the signals of the detectors associated with the third-order sub-beams may be used for even finer alignment, and so forth. This may continue as long as the sub-beams used still have sufficient intensity to be detected in a reliable manner.

Another possibility is based on the recognition that the intensity of certain diffraction orders is increased at the expense of other diffraction orders when given process layers are provided on the substrate. In that case, a direct choice of the preferred orders may be made for the alignment. Under circumstances, said possibilities may also be combined.

It is also possible to calibrate the alignment unit before a batch of substrates is illuminated with a mask pattern or at the beginning of a production day. For a number of positions of the substrate mark the detector signals for each of the diffraction orders are measured. The results of these measurements are stored in graphs or tables showing for each position of the substrate mark the value of the detector signal for each diffraction order. During illuminating the substrates the alignment measurement can be performed by measuring only the, relatively large, detector signals of the lower diffraction orders, for example die first three orders. By interpolation the corresponding value for a higher diffraction order, for example the seventh order, can be determined. In this way it is possible to determine alignment errors with high resolution and large signal amplitude.

Hitherto, only the alignment of the substrate with respect to an apparatus reference in the form of reference gratings has been described. With the same alignment unit also the position of the substrate holder or table can be determined. To that end this holder or table is provided with an alignment mark similar to the substrate alignment mark. The position of the substrate holder mark with respect to the reference in the alignment unit is determined. The position of the substrate mark with respect to the substrate holder mark is then known. To be able to fix the mutual position of the mask pattern and the substrate, a further measurement is necessary, namely that of the position of the mask pattern with respect to the substrate holder or table. For this further measurement, the on-axis alignment unit described with reference to FIGS. 1, 2 and 3 may be used, with which mask marks are aligned with respect to marks of the substrate holder. Not only the double alignment unit as shown in FIG. 3 but also a single alignment unit as described in U.S. Pat. No. 4,251,160 may be used.

Another possibility of aligning the mask pattern with respect to the substrate table is the use of the image sensor unit described in, for example U.S. Pat. No. 4,540,277. In such a unit, a mask alignment mark is imaged by means of projection radiation on a corresponding and transmissive reference mark in the substrate table. In this table, a detector may be arranged behind the reference mark for converting the radiation passed by the reference mark into an electric signal. In first instance, this image sensor unit is intended for, for example calibrating an on-axis alignment unit which operates with alignment radiation having a wavelength which is considerably different from that of the projection radiation, or for checking the image quality of the image formed by the projection lens system and for measuring distortions and aberrations which may occur, but it is also eminently suitable for aligning the mask pattern with respect to the substrate table. Instead of the transmission image sensor unit described in U.S. Pat. No. 4,540,277, an image sensor unit operating in reflection may be alternatively used for aligning a mask mark with respect to a substrate table mark. Such a unit, which is described in U.S. Pat. No. 5,144,363, operates with a reflective mark on the table and comprises a relatively large number of detectors which observe the mark at different angles and which, together with the associated optical systems, are provided in a sensor plate which is arranged between the projection lens system and the substrate table.

Figure 13:
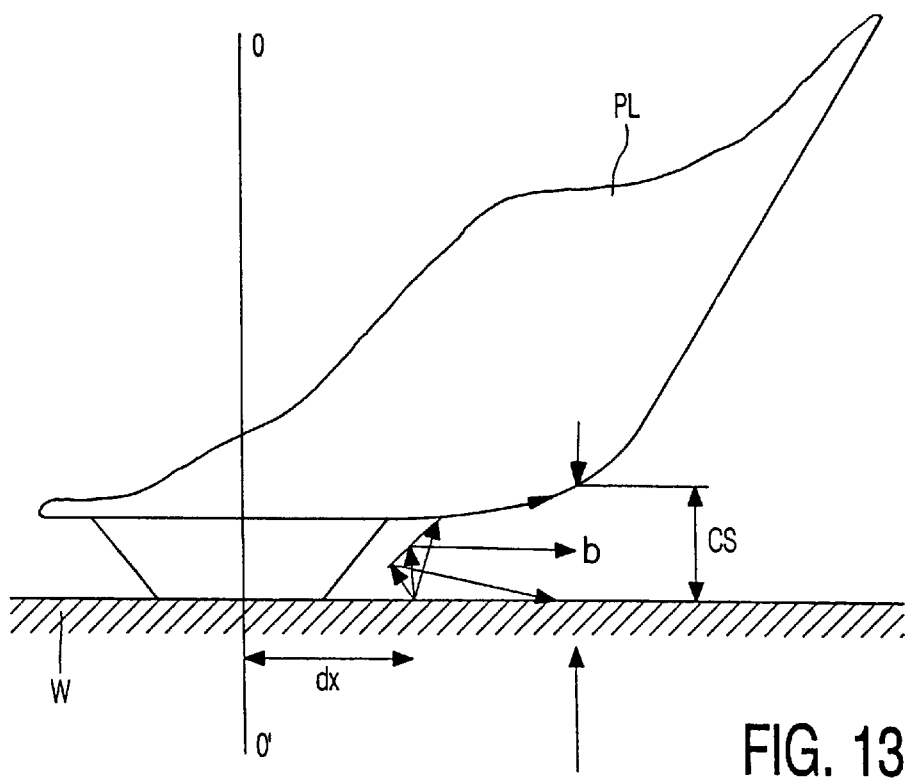
FIG. 13 shows the position of the alignment unit with respect to the projection lens and the substrate.

The off-axis alignment unit according to the invention must also be provided in this space. This unit must be arranged as close as possible to the center of the substrate table and requires a building space which is conical with an aperture of, for example 0.3. In practice, the length of the Y slide of the substrate table approximately corresponds to the radius of the substrate for which the projection apparatus has been designed, for example 102 mm for an 8-inch substrate, so that there is little room for building in the alignment unit in this direction. The X slide of the substrate table is, however, for example 25 mm longer than the Y slide, so that an alignment unit which can handle an 8-inch substrate can be placed at a distance of 25 mm from the optical axis of the projection lens system. This is shown very diagrammatically in FIG. 13 which shows a part of the projection lens system PL and its optical axis OO'. The dotted portion between the projection lens system and the substrate W indicates the space which is occupied by the projection beam, and the arrows marked b indicate sub-beams of the alignment radiation. The alignment beam is incident on the substrate at a distance dx from the axis OO' which distance is thus, for example 25 mm. The reference CS denotes the critical position for the available building space. At this position, the diameter of the cone within which the sub-beams with the different diffraction orders are situated is equal to the distance to the substrate, multiplied by twice the value of the numerical aperture. For a numerical aperture of 0.25 and a value of 32 mm for said distance, said diameter, hence the required vertical space at the location of CS, is 16 mm. This is a reasonable requirement in practice. However, this vertical space may not be completely available. In that case, two off-axis alignment units may be used which are arranged diametrically with respect to each other and can each cover a part of the substrate.

Figure 14:
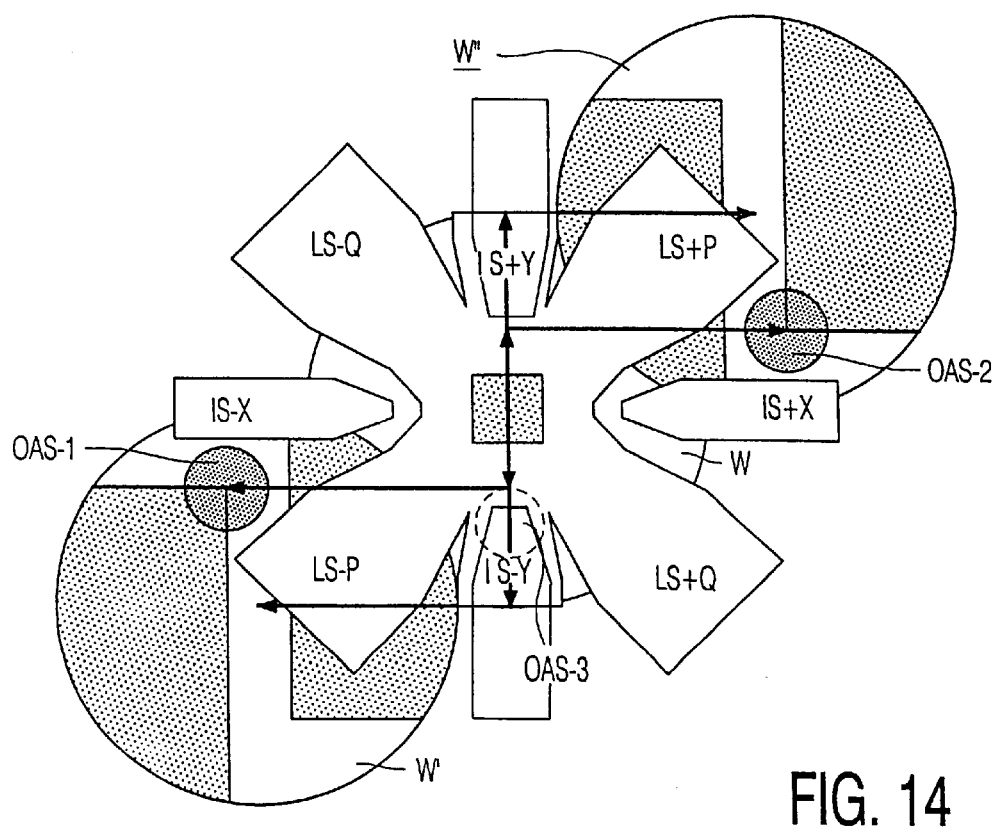
FIG. 14 shows the positions of the sub-units of a double alignment unit with respect to an image sensor unit and a focusing and leveling unit of the projection apparatus.

FIG. 14 shows the measuring spots of these two off-axis alignment units, denoted by OAS1 and OAS2. This Figure, which is also diagrammatic, shows the substrate, both in a central position, denoted by W, and at the two positions, denoted by W' and W", in which it is within the range of the spots OAS1 and OAS2. The pointed areas denote those areas of the substrate which are within the range of the off-axis alignment units. It will be evident that the, white, central strip and the left upper part and the right lower part of the substrate are not within the range of the units OAS1 and OAS2 so that the substrate marks which must cooperate with these units must be provided outside the white areas and within the dotted areas of the substrate. For the purpose of orientation, FIG. 14 also shows the different branches of a reflective image sensor unit for the +X and −X directions (IS+X, IS−X) and for the +Y and −Y directions (IS+Y, IS−Y) and the components of a focus and level unit denoted by LS−Q, LS+Q, LS+P and LS−P. Such a unit is described in U.S. Pat. No. 5,191,200 and serves for measuring a focus error, hence a deviation between the image plane of the projection lens system and the plane of the photosensitive layer on the substrate, and for measuring a global or local tilt of the substrate.

If the reflective image sensor IS, or the part IS−Y of it, is omitted from the embodiment of FIG. 14, it becomes possible to arrange the off-axis alignment unit such that its measuring spot is situated closer to the axis of the projection system, for example at a distance of 65 mm, as indicated by the broken circle OAS-3 in FIG. 14. Then the range of a single off-axis alignment unit is sufficient to cover a whole wafer and only one such unit is needed.

The above-mentioned values for the different parameters are only given by way of example and for the purpose of orientation. These values may be very different for various apparatuses.

As hitherto described the off-axis alignment unit is arranged in the projection column, comprising the mask holder, the projection system and the substrate holder, of the lithographic projection apparatus. With the increasing demand for larger IC's having smaller details, and thus comprising more electronic components, the alignment procedure becomes more and more time-consuming. The throughput of these apparatus therefore tends to decrease without further measures. It has already been proposed to add to such apparatus a separate measuring station. In this station the position in, for example the X-, Y- and Z-direction, of a substrate is measured before this wafer is brought in the projection column, or projection station. In the measuring station substrate marks can be aligned with respect to alignment marks on the substrate holder or table. After the substrate, together with the holder has been placed in the projection system, only a mask alignment mark needs to be aligned with respect to the substrate holder mark, which takes only a short time. As in the apparatus, comprising a separate measuring station and projection station, during the illumination of a first substrate in the projection station a second substrate is being measured in the measurement station, the throughput of this apparatus is considerably larger than in an apparatus without a separate measurement station. The alignment unit used in the measuring station for aligning a substrate mark with respect to a substrate holder mark is preferably an off-axis alignment system as described herein before.

The invention is described with reference to its use in apparatus for step-and-scan imaging of a mask pattern on a substrate for manufacturing ICs, but this does not mean that it is limited thereto. The invention may be alternatively used in such an apparatus for manufacturing integrated, or plenary, optical systems, guidance and detection patterns for magnetic domain memories, or liquid crystalline display panels. The projection apparatus may not only be an optical apparatus, in which the projection beam is a beam of electromagnetic radiation and the projection system is an optical projection lens system, but also an apparatus in which the projection beam is a charged-particle beam such as an electron beam, an ion beam or an X-ray beam, in which an associated projection system, for example an electron lens system is used. Generally, the invention may be used in imaging systems with which images having very small details must be formed.

What is claimed is:

1. A lithographic projection apparatus comprising:
   a radiation source to supply a projection beam of radiation;
   a mask holder;
   a substrate holder;
   a projection system arranged between said mask holder and said substrate holder; and
   an alignment system for aligning a substrate to be held by the substrate holder in relation to a mask to be held by the mask holder, said alignment system comprising an alignment unit for aligning a diffractive alignment mark indicative of a position and orientation of the substrate with respect to a reference, wherein the alignment unit is adapted to separately image onto said reference and separately detect a number of at least three order sub-beams diffracted by the alignment mark in respective different diffraction orders higher than 0, each of the detected order sub-beams comprising information about a position of the alignment mark with respect to the reference.

2. A lithographic projection apparatus as claimed in claim 1, wherein said alignment unit is an off-axis alignment unit and said alignment system further comprises an on-axis alignment unit constructed and arranged to align the substrate table with respect to the mask.

3. A lithographic projection apparatus as claimed in claim 2, wherein said on-axis alignment unit comprises a radiation source which emits a beam of radiation having a wavelength different from a wavelength of the radiation of the projection beam.

4. A lithographic projection apparatus as claimed in claim 2, wherein the on-axis alignment unit comprises an image sensor operating with radiation of the projection beam.

5. A lithographic projection apparatus as claimed in claims 1, wherein the alignment mark comprises a one-dimensional grating.

6. A lithographic projection apparatus as claimed in claim 1, wherein said alignment system is an off-axis alignment system.

7. A lithographic projection apparatus as claimed in claim 6, wherein the off-axis alignment system comprises a pair of off-axis alignment units, the pair of off-axis alignment units being arranged on opposed sides of the projection system.

8. A lithographic projection apparatus as claimed in claim 1, further comprising a projection station for projecting a mask pattern onto a first substrate and a measuring station for measuring the position of a second substrate.

9. A lithographic projection apparatus for imaging of a mask pattern in a mask onto a substrate, said apparatus comprising:
   a radiation source to supply a projection beam of radiation;
   a mask table provided with a mask holder constructed to hold the mask;

a substrate table provided with a substrate holder constructed to hold the substrate; and a projection system constructed and arranged to image an irradiated portion of the mask onto a target portion of the substrate; and an alignment system constructed and arranged to align the substrate with respect to the mask, said alignment system comprising a directing mechanism to direct an alignment beam of radiation onto a diffractive alignment mark indicative of a position and orientation of the substrate, the diffractive alignment mark producing from said alignment beam order sub-beams, each of the order sub-beams comprising radiation of one diffraction order, said alignment system further comprising an imager to combine and image plus and minus sub-beams of an order associated with a diffraction order higher than two onto a reference, said plus and minus sub-beams being associated with opposite diffraction order signs of said one diffraction order.

10. A lithographic projection apparatus as claimed in claim 9, wherein said alignment system is an off-axis alignment system.

11. A lithographic projection apparatus comprising:

a radiation source to supply a projection beam of radiation;

a mask holder;

a substrate holder;

a projection system arranged between said mask holder and said substrate holder; and an alignment system for aligning a substrate to be held by the substrate holder in relation to a mask to be held by the mask holder, said alignment system comprising an alignment unit for aligning a diffractive alignment mark indicative of a position and orientation of the substrate with respect to a reference, wherein the alignment unit is adapted to separately detect a number of at least three order sub-beams diffracted by the alignment mark in respective different diffraction orders higher than 0 each of the detected order sub-beams comprising information about a position of the alignment mark with respect to the reference, wherein said reference comprises a number of separate reference elements equal in number to the number of used diffraction orders and having the same shape as the alignment mark, and wherein said alignment system comprises a separate detector associated with each of the reference elements for receiving a given order sub-beam from the alignment mark and passed by an associated one of said reference elements and converting the given order sub-beam into an electric signal.

12. A lithographic apparatus as claimed in claim 11, wherein the reference elements comprise gratings.

13. A lithographic projection apparatus as claimed in claim 11, wherein a radiation path between the alignment mark and the reference elements comprises a first lens system arranged in the radiation paths of the order sub-beams, a structure of deflection elements arranged to receive the order sub-beams from the first lens system and to give the order sub-beams different respective directions, and a second lens system arranged to receive the order sub-beams from the structure of deflection elements and to image the order sub-beams onto associated ones of the reference elements.

14. A lithographic projection apparatus as claimed in claim 13, wherein a distance along the radiation path between the first lens system and a plane in which the alignment mark is present is equal to the focal length of the first lens system, wherein a distance along the radiation path between the second lens system and a plane in which the reference elements are present is equal to the focal length of the second lens system, and wherein a distance along the radiation path between the first lens system and the second lens system is equal to the sum of the focal length of the first lens system and the focal length of the second lens system.

15. A lithographic projection apparatus as claimed in claim 13, wherein the structure of deflection elements comprises a pair of deflection elements for each of the diffraction orders to deflect plus and minus sub-beams of an order sub-beam associated with one of the diffraction orders such that the second lens system images the plus and minus sub-beams onto one associated reference element, said plus and minus sub-beams being associated with opposite diffraction order signs of said one diffraction order.

16. A lithographic projection apparatus as claimed in claim 13, wherein the structure of deflection elements comprises a number of discrete transparent wedges, which number corresponds to the number of order sub-beams used.

17. A lithographic projection apparatus as claimed in claim 13, wherein the structure of deflection elements comprises a number of transparent wedge-shaped plates arranged one behind the other in the radiation path of the order sub-beams and having different wedge angles and a number of openings to pass radiation undeflected, the number of openings and their positions being such that with a combination of n plates, $2^n$ diffraction orders can be deflected in different directions.

18. A lithographic projection apparatus as claimed in claim 13, wherein the alignment unit comprises two radiation sources, the two radiation sources supplying two alignment beams of radiation having different wavelengths, and wherein the alignment unit comprises a beam splitter arranged to combine the two alignment beams on a radiation path to the alignment mark and to split the two alignment beams deriving from the alignment mark and associated with the two incident alignment beams, and wherein the alignment unit comprises a separate structure of deflection elements and reference elements for each of the two alignment beams.

19. A lithographic projection apparatus as claimed in claim 11, wherein the alignment mark comprises two mutually perpendicular one-dimensional gratings, wherein the structure of deflection elements is a two-dimensional structure and wherein the reference is a two-dimensional reference.

20. A lithographic projection apparatus for imaging of a mask pattern in a mask onto a substrate, said apparatus comprising:

a radiation source to supply a projection beam of radiation;

a mask table provided with a mask holder constructed to hold the mask;

a substrate table provided with a substrate holder constructed to hold the substrate; and a projection system constructed and arranged to image an irradiated portion of the mask onto a target portion of the substrate; and an alignment system constructed and arranged to align the substrate with respect to the mask, said alignment system comprising a directing mechanism to direct an alignment beam of radiation onto a diffractive alignment mark indicative of a position and orientation of the substrate, the diffractive alignment mark producing from said alignment beam order sub-beams, each of the order sub-beams comprising radiation of one diffraction order, said alignment system further comprising an imager to combine and image plus and minus sub-beams of an order associated with a diffraction order higher than two onto a reference, said plus and minus sub-beams being associated with opposite diffraction order signs of said one diffraction order, wherein said reference comprises plural reference elements and wherein said imager combines and images the plus and minus sub-beams of more than one order sub-beam onto respective ones of the reference elements, each order sub-beam being imaged onto its associated reference element.

21. A lithographic protection apparatus as claimed in claim 20, wherein said diffractive alignment mark is provided on one of the substrate, the substrate holder, and the substrate table.

22. A lithographic projection apparatus as claimed in claim 21, wherein the alignment mark comprises a one-dimensional grating.

23. A lithographic projection apparatus for imaging of a mask pattern in a mask onto a substrate, said apparatus comprising:

a radiation source to supply a projection beam of radiation;

a mask table provided with a mask holder constructed to hold a mask;

a substrate table provided with a substrate holder constructed to hold a substrate; and a projection system constructed and arranged to image an irradiated portion of the mask onto a target portion of the substrate; and an alignment system for aligning the substrate with respect to the mask, said alignment system comprising a directing mechanism to direct an alignment beam of radiation onto a diffractive alignment mark indicative of a position and orientation of the substrate, the diffractive alignment mark producing from said alignment beam order sub-beams, each of the order sub-beams comprising radiation of one diffraction order, said alignment system further comprising an imager to combine and image plus and minus sub-beams of an order associated with a diffraction order higher than two onto a reference, said plus and minus sub-beams being associated with opposite diffraction order signs of said one diffraction order, wherein said reference comprises plural reference elements and wherein said imager combines and images the plus and minus sub-beams of more than one order sub-beam onto respective ones of the reference elements, each order sub-beam being imaged onto its associated reference element, wherein said reference comprises a number of separate reference elements equal in number to the number of used diffraction orders and having the same shape as the alignment mark, and wherein said alignment system comprises a separate detector associated with each of the reference elements for receiving a given order sub-beam from the alignment mark and passed by an associated one of said reference elements and converting the given order sub-beam into an electric signal.

24. A lithographic apparatus as claimed in claim 23, wherein the reference elements comprise gratings.

25. A lithographic projection apparatus as claimed in claim 23, wherein the alignment mark comprises two mutually perpendicular one-dimensional gratings, wherein the structure of deflection elements is a two-dimensional structure and wherein the reference is a two-dimensional reference.

26. A lithographic projection apparatus as claimed in claim 23, wherein a radiation path between the alignment mark and the reference elements comprises a first lens system arranged in the radiation paths of the order sub-beams, a structure of deflection elements arranged to receive the order sub-beams from the first lens system and to give the order sub-beams different respective directions, and a second lens system arranged to receive the order sub-beams from the structure of deflection elements and to image the order sub-beams onto associated ones of the reference elements.

27. A lithographic projection apparatus as claimed in claim 26, wherein the structure of deflection elements comprises a number of transparent wedge-shaped plates arranged one behind the other in the radiation path of the order sub-beams and having different wedge angles and a number of openings to pass radiation undeflected, the number of openings and their positions being such that with a combination of n plates, $2^n$ diffraction orders can be deflected in different directions.

28. A lithographic projection apparatus as claimed in claim 26, wherein the structure of deflection elements comprises a pair of deflection elements for each of the diffraction orders to deflect plus and minus sub-beams of an order sub-beam associated with one of the diffraction orders such that the second lens system images the plus and minus sub-beams onto one associated reference element, said plus and minus sub-beams being associated with opposite diffraction order signs of said one diffraction order.

29. A lithographic projection apparatus as claimed in claim 26, wherein a distance along the radiation path between the first lens system and a plane in which the alignment mark is present is equal to the focal length of the first lens system, wherein a distance along the radiation path between the second lens system and a plane in which the reference elements are present is equal to the focal length of the second lens system, and wherein a distance along the radiation path between the first lens system and the second lens system is equal to the sum of the focal length of the first lens system and the focal length of the second lens system.

30. A lithographic projection apparatus as claimed in claim 26, wherein the structure of deflection elements comprises a number of discrete transparent wedges, which number corresponds to the number of order sub-beams used.

31. A lithographic projection apparatus as claimed in claim 24, wherein the directing mechanism comprises two radiation sources, the two radiation sources supplying two alignment beams of radiation having different wavelengths, wherein the imager comprises a beam splitter arranged to combine the two alignment beams on a radiation path to the alignment mark and to split the two alignment beams deriving from the alignment mark and associated with the two incident alignment beams, and wherein the alignment system comprises a separate structure of deflection elements and reference elements for each of the two alignment beams.

32. A lithographic projection apparatus as claimed in claim 24, further comprising an on-axis alignment system constructed and arranged to align the substrate table with respect to the mask, and wherein the first-mentioned alignment system is an off-axis alignment system.

33. A lithographic projection apparatus as claimed in claim 32, wherein the on-axis alignment unit comprises an image sensor operating with radiation of the projection beam.

34. A lithographic projection apparatus as claimed in claim 32, wherein said on-axis alignment unit comprises a radiation source which emits a beam of radiation having a wavelength different from a wavelength of the radiation of the projection beam.

35. A lithographic projection apparatus for imaging of a mask pattern in a mask onto a substrate, said apparatus comprising:

a radiation source to supply a projection beam of radiation;

a mask table provided with a mask holder constructed to hold the mask;

a substrate table provided with a substrate holder constructed to hold the substrate; and a projection system constructed and arranged to image an irradiated portion of the mask onto a target portion of the substrate; and an alignment system constructed and arranged to align the substrate with respect to the mask, said alignment system comprising a directing mechanism to direct an alignment beam of radiation onto a diffractive alignment mark indicative of a position and orientation of the substrate, the diffractive alignment mark producing from said alignment beam order sub-beams, each of the order sub-beams comprising radiation of one diffraction order, said alignment system further comprising an imager to combine and image plus and minus sub-beams of an order associated with a diffraction order higher than two onto a reference, said plus and minus sub-beams being associated with opposite diffraction order signs of said one diffraction order, wherein said alignment system is an off-axis alignment system, and wherein the off-axis alignment system comprises a pair of off-axis alignment units, the pair of off-axis alignment units being arranged on opposed sides of the projection system.

* * * * *